(12) United States Patent
Sotani et al.

(10) Patent No.: US 9,871,403 B2
(45) Date of Patent: Jan. 16, 2018

(54) POWER FEEDING APPARATUS FOR SOLAR CELL, AND SOLAR CELL SYSTEM

(71) Applicant: Panasonic Intellectual Property Management Co., Ltd., Osaka-shi, Osaka (JP)

(72) Inventors: Naoya Sotani, Hyogo (JP); Yasuto Miyake, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 101 days.

(21) Appl. No.: 14/960,898

(22) Filed: Dec. 7, 2015

(65) Prior Publication Data

US 2016/0094084 A1 Mar. 31, 2016

Related U.S. Application Data

(63) Continuation of application No. PCT/JP2014/003061, filed on Jun. 9, 2014.

(30) Foreign Application Priority Data

Jun. 18, 2013 (JP) .................................. 2013-127121

(51) Int. Cl.
*H02J 7/00* (2006.01)
*H01M 10/44* (2006.01)
*H01M 10/46* (2006.01)
*H02J 7/35* (2006.01)
*H01L 31/02* (2006.01)
*H02S 40/38* (2014.01)

(52) U.S. Cl.
CPC .......... *H02J 7/35* (2013.01); *H01L 31/02021* (2013.01); *H02S 40/38* (2014.12); *Y02E 10/50* (2013.01)

(58) Field of Classification Search
CPC ...................................................... H02J 7/35
(Continued)

(56) References Cited

U.S. PATENT DOCUMENTS 4,383,211 A 5/1983 Staler
8,264,193 B2 * 9/2012 Kular ....................... H02J 7/35
320/101

(Continued)

FOREIGN PATENT DOCUMENTS

JP 62154122 A 7/1987
JP 11046457 A 2/1999
(Continued)

OTHER PUBLICATIONS

Extended European Search Report corresponding to Application No. 14813749.0-1804/3012942 PCT/JP2014/003061; dated May 23, 2016.

(Continued)

*Primary Examiner* — Edward Tso
*Assistant Examiner* — Ahmed Omar
(74) *Attorney, Agent, or Firm* — Cantor Colburn LLP

(57) ABSTRACT

A power feeding apparatus for solar cells has: a voltage regulator, i.e., a voltage adjusting unit; a relay, i.e., a switch unit; and a control unit. The voltage regulator executes voltage adjustment with respect to an input voltage, and outputs, to a power output terminal, a voltage adjusted to a previously set voltage or lower. The relay is provided on a bypass line that is connected between a power input terminal and the power output terminal without having the voltage regulator therebetween, and the relay performs switching such that the bypass line is connected or interrupted. In the cases where the input voltage is equal to or lower than the predetermined voltage, the control unit performs control such that the bypass line is connected by means of the relay, and the input voltage is outputted from the power output terminal.

6 Claims, 14 Drawing Sheets

(58) Field of Classification Search
USPC .......................................................... 320/101
See application file for complete search history.

(56) References Cited

U.S. PATENT DOCUMENTS

| 2006/0065302 A1 | 3/2006 | Gibson et al. |
| 2006/0244424 A1 | 11/2006 | Nelson |
| 2010/0288327 A1 | 11/2010 | Lisi et al. |

FOREIGN PATENT DOCUMENTS

| JP | 2008539561 A | 11/2008 |
| JP | 2013046563 A | 3/2013 |
| WO | 2010015855 A2 | 2/2010 |

OTHER PUBLICATIONS

International Preliminary Report on Patentability and Written Opinion of the International Searching Authority corresponding to Application No. PCT/JP2014/003061; dated Dec. 22, 2015, with English translation.

Notification of Transmittal of the International Preliminary Report on Patentability and its translation corresponding to Application No. PCT/JP2014/003061; dated Dec. 30, 2015.

Second and Supplementary Notice Informing the Applicant of the Communication of the International Application corresponding to Application No. PCT/JP2014/003061; dated Oct. 22, 2015.

International Search Report corresponding to Application No. PCT/JP2014/003061; dated Sep. 2, 2014, with English translation.

\* cited by examiner

POWER FEEDING APPARATUS FOR SOLAR CELL, AND SOLAR CELL SYSTEM

CROSS REFERENCE TO RELATED APPLICATIONS

The present application is a continuation under 35 U.S.C. §120 of PCT/JP2014/003061, filed Jun. 9, 2014, which is incorporated herein by reference and which claimed priority to Japanese Patent Application No. 2013-127121 filed Jun. 18, 2013. The present application likewise claims priority under 35 U.S.C. §119 to Japanese Patent Application No. 2013-127121 filed Jun. 18, 2013, the entire content of which is also incorporated herein by reference.

TECHNICAL FIELD

The present invention relates to a power feeding apparatus for solar cells and a solar cell system.

PRIOR ART

Patent Publication 1 discloses a charger body (11) including a secondary battery (114), a charging circuit (113) for charging a secondary battery from an external DC power supply (12), a boost DC/DC converter (115), the first input circuit (111) for feeding power from a secondary battery to the DC/DC converter, and the second input circuit (112) for feeding power from the external DC power supply to the boost DC/DC converter. Other charger bodies including a solar cell panel for charging an internal secondary battery are also marketed.

PRIOR ART PUBLICATION

Patent Publication

Patent Publication 1: Japanese Patent Laid-Open No. 2013-46563

SUMMARY OF THE INVENTION

Problem to be Solved by the Invention

When power generated by a solar cell is used to charge a secondary battery of a to-be-charged machine such as a mobile terminal unit, the power is adjusted to have a voltage having a predetermined range suitable for charging to output a charging voltage such as a USB charging input. For example, the generated power of a solar cell may be configured so that a voltage adjustment unit functioning as a DC/DC converter or a voltage regulator is used to adjust the charging voltage to a predetermined voltage or less to output the voltage to a to-be-charged machine. However, a risk may be caused in which power loss is caused in the voltage adjustment unit to prevent the effective use of the power generated from the solar cell.

It is an objective of the present invention to provide a power feeding apparatus for solar cells and a solar cell system with which a charging voltage can be adjusted to a predetermined voltage or less and the power generated from a solar cell can be effectively used to output charging power.

Means for Solving the Problem

The power feeding apparatus for solar cells according to the present invention is a power feeding apparatus for solar cells that adjusts an input voltage inputted from a solar cell to a predetermined voltage or less to output the adjusted voltage as a charging output voltage of a secondary battery. The power feeding apparatus for solar cells includes a voltage adjustment unit that subjects an input voltage to a voltage adjustment to output a voltage adjusted to a voltage set in advance or less, a switching unit that is provided between a power input terminal and a power output terminal without being routed via a voltage adjustment unit and that switches the connection and disconnection of a bypass line, and a control unit that is configured, when an input voltage is equal to or lower than a predetermined voltage, to use the switching unit to connect the bypass line to control input voltage so as to be outputted from the power output terminal.

The solar cell system according to the present invention includes a power feeding apparatus for solar cells according to the present invention and solar cells connected to the power feeding apparatus for solar cells.

Effect of the Invention

According to a power feeding apparatus for solar cells and a solar cell system of the present invention, a charging voltage can be adjusted to be equal to or lower than a predetermined voltage and power generated from a solar cell can be effectively used to output charging power.

EMBODIMENT FOR CARRYING OUT THE INVENTION

[First Embodiment]

Prior to the specific description of a solar cell system in an embodiment, the concept of this embodiment will be described first. In this embodiment, a solar cell system includes a solar cell and a power feeding apparatus connected to the solar cell. The power feeding apparatus is configured to include a voltage adjustment unit, a switching unit, and a control unit. The voltage adjustment unit executes a voltage adjustment on an input voltage inputted from the solar cell to the power feeding apparatus to output a voltage adjusted to a predetermined voltage or less. The switching unit is provided in a bypass line connected between a power input terminal and a power output terminal without being routed via a voltage adjustment unit, and switches the connection and disconnection of the bypass line. The control unit is configured, when an input voltage is equal to or lower than a predetermined voltage, to use the switching unit to connect the bypass line so that the input voltage is outputted from the power output terminal. This can consequently allow the power generated from a solar cell to be effectively used and an output for charging a secondary battery can be outputted.

Figure 1:
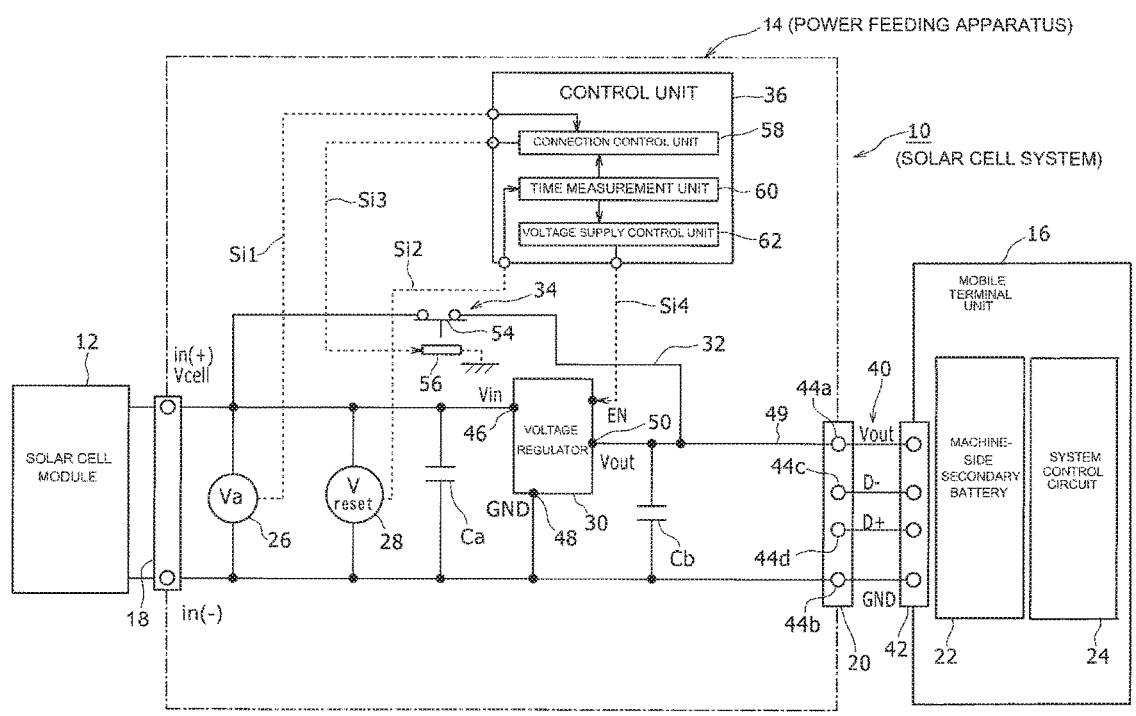
FIG. 1 is a circuit diagram illustrating a case where a solar cell system is connected to a mobile terminal unit in an embodiment.

Next, the following section will describe a solar cell system in an embodiment with reference to the drawings. As shown in FIG. 1, a solar cell system 10 includes a solar cell module 12 and a power feeding apparatus 14 connected to the solar cell module 12. During use, the power feeding apparatus 14 is connected to a mobile terminal unit 16 as a to-be-charged machine. The power feeding apparatus 14 adjusts an input voltage Vcell inputted from the solar cell module 12 through the power input terminal 18 to a predetermined voltage or less to output the adjusted charging output voltage from the power output terminal 20. If a to-be-charged machine has a charging standard based on a USB standard, the power feeding apparatus 14 outputs power adjusted to 5.25V or less for example through the power output terminal 20.

The mobile terminal unit 16 includes therein a machine-side secondary battery 22 and a system control circuit 24 and is charged with charging power outputted from the power output terminal 20. The mobile terminal unit 16 is a tablet computer, a mobile information terminal unit such as a PDA (Personal Digital Assistant), or a mobile phone for example. The system control circuit 24 receives power from the machine-side secondary battery 22 to control the mobile terminal unit 16. For example, the mobile terminal unit 16 has a display unit and an operation unit (not shown). The system control circuit 24 causes the display unit to display information depending on the operation of the operation unit. The machine-side secondary battery 22 is a lithium-ion battery (LiB) or a nickel hydride battery (NiMH) for example.

The power feeding apparatus 14 may be connected not to the mobile terminal unit 16 but to another to-be-charged machine that includes therein a secondary battery. In any case, the to-be-charged machine can have a function to limit an input voltage for charging a secondary battery to a predetermined voltage or to a predetermined voltage range. The to-be-charged machine also may be configured, when a decrease of the supply capability of the power feeding apparatus 14 causes the input current during charging to be equal to or lower than a predetermined value, to have a function to limit the upper limit of the input current during charging to a current value lower than that of an initial status. For example, the to-be-charged machine may be an electrical device fixed in a room.

The power feeding apparatus 14 is configured to include a power input terminal 18, a power output terminal 20, the first signal generation unit 26, the second signal generation unit 28, a voltage regulator 30, a bypass line 32, a relay 34, and a control unit 36. In FIG. 1, a power line is shown by the solid line and a signal line is shown by the broken line. In the following description, all elements in all drawings will be denoted with the same reference numerals.

Figure 2:
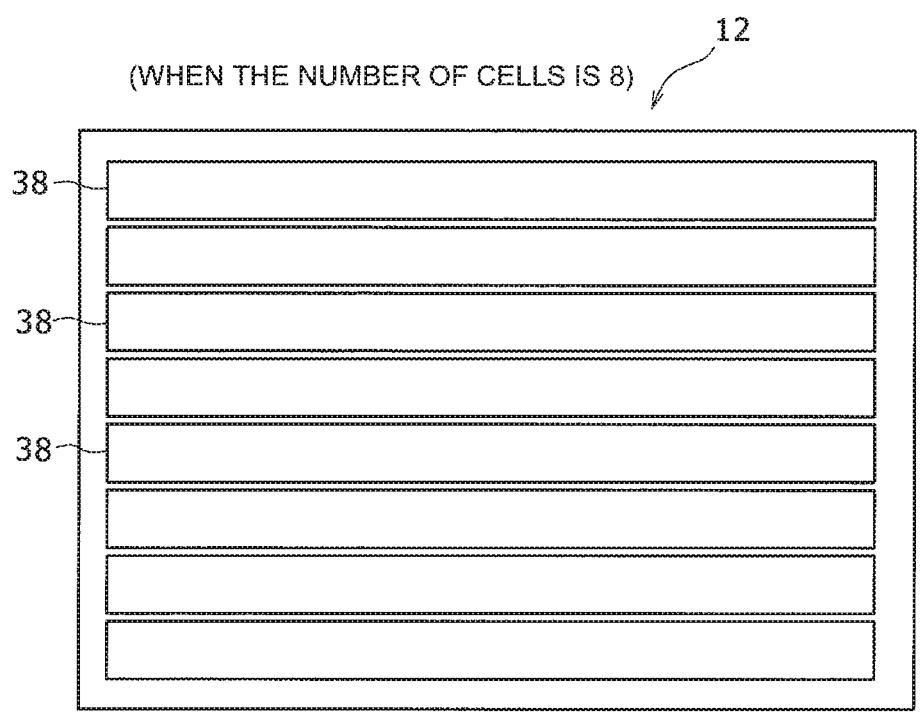
FIG. 2 illustrates one example of a solar cell module in an embodiment.

The power input terminal 18 is connected to a positive electrode-side terminal and a negative electrode-side terminal of the solar cell module 12. As shown in FIG. 2, the solar cell module 12 includes a plurality of solar cells 38 electrically connected in series. In FIG. 2, right solar cells 38 are serially connected. However, the invention does not limit the number of the solar cells 38.

The solar cell module 12 may be configured so that a plurality of serially-connected solar cells 38 are assumed as one set and a plurality of sets of the solar cells 38 may be mutually connected in parallel. In FIG. 2, the solar cells 38 are arranged in one column. However, the solar cells 38 may be arranged in a plurality of columns and may be serially electrically connected. A plurality of the solar cell modules 12 may also be used. The solar cell module 12 can be, for example, a crystalline silicon solar cell, a thin film silicon solar cell, or a compound solar cell.

Returning to FIG. 1, the power output terminal 20 is a USB terminal for which a service voltage is limited within a predetermined range. The power output terminal 20 can be connected via a USB cable 40 to a USB terminal 42 provided in the mobile terminal unit 16. The power output terminal 20 has power feeding terminals 44a and 44b of a positive electrode and a negative electrode and signal terminals 44c and 44d used for data transmission and receipt. Since the USB standard is 5V, the power output terminal 20 outputs the output voltage Vout adjusted by the power feeding apparatus 14, for example, to have a value within a predetermined range of 5V±0.25V. When the power feeding apparatus 14 performs a charging operation, the power feeding apparatus 14 may be configured, depending on the specification of the mobile terminal unit 16, to allow the signal terminals 44c and 44d to output predetermined signals. For example, when the power feeding apparatus 14 performs a charging operation, the signal terminals 44c and 44d are float-shorted. In FIG. 1, the power feeding apparatus 14-side circuit connected to the signal terminals 44c and 44d are not shown. The power output terminal may be a terminal for which a service voltage other than a USB terminal is limited to a predetermined range.

The first signal generation unit 26 is connected to the output side of the power input terminal 18. When the input voltage Vcell inputted between the positive electrode and negative electrode of the power input terminal 18 is higher than a predetermined voltage Va set in advance, the first signal Si1 of a High level is outputted to the control unit (which will be described later). When the input voltage Vcell inputted between the positive electrode and negative electrode of the power input terminal 18 is equal to or lower than the predetermined voltage Va, the first signal Si1 of a Low level is outputted.

The second signal generation unit 28 is connected to the output side of the power input terminal 18. When the input voltage Vcell inputted between the positive electrode and negative electrode of the power input terminal 18 is higher than the second predetermined voltage Vreset set in advance, the second signal Si2 having a High level (high level) is outputted to the control unit 36. When the input voltage Vcell inputted between the positive electrode and negative electrode of the power input terminal 18 is equal to or lower than the second predetermined voltage Vreset, then the second signal Si2 having a Low level (low level) is outputted.

The first signal generation unit 26 and the second signal generation unit 28 are configured to include a comparator for example. It can be assumed that the Low level is 0 and the High level is 1 in the following description. In this embodiment, the second predetermined voltage Vreset is set to a value equal to or lower than the predetermined voltage Va (Vreset≤Va). The predetermined voltage Va is preferably set in accordance with the charging standard of a to-be-charged machine. For example, the predetermined voltage Va can be 5.0V and the second predetermined voltage Vreset can be 4.8V. The predetermined voltage Va and the second predetermined voltage Vreset may both have the same value. A circuit for comparing the predetermined voltage Va and the second predetermined voltage Vreset with the input voltage Vcell is not limited to the configuration as described above. For example, a configuration described later with reference to FIG. 9 having a voltage detection unit and the control unit 36 can also be used.

The voltage regulator 30 has an input terminal 46 connected to the positive electrode side of the power input terminal 18, a GND terminal 48 connected to the negative electrode side of the power input terminal 18 and the power output terminal 20, and an output terminal 50 connected to the positive electrode-side power feeding terminal 44a of the power output terminal 20 via an output line 49. The voltage regulator 30 is a low saturation-type voltage adjustment unit that subjects the input voltage Vcell to a voltage adjustment to output, to the power output terminal 20, a voltage adjusted to a voltage set in advance or less. For example, the voltage Vreg adjusted by the voltage regulator 30 is higher than the second predetermined voltage Vreset and is equal to the predetermined voltage Va (Vreset<Vreg=Va).

The voltage regulator 30 also has an enable terminal EN that is a control terminal to control the ON/Off operation of the voltage regulator 30 itself. When the enable signal Si4 inputted from the control unit 36 to the enable terminal EN has a High level, the voltage regulator 30 is turned ON and the voltage-adjusted power is outputted. When the input voltage Vin is higher than a predetermined voltage, a voltage outputted from the output terminal 50 is adjusted to a regulated voltage equal to or lower than a predetermined voltage. For example, when the to-be-charged machine has a charging standard based on a USB standard and the input voltage Vin is higher than 5.0V, the voltage regulator 30 regulates the output voltage to a value equal to or lower than 5.0V.

When the enable signal Si4 has a Low level on the other hand, the voltage regulator 30 is turned OFF and the voltage regulator 30 has an output voltage Vout having a high impedance.

The bypass line 32 is connected between the positive electrode-side terminal of the power input terminal 18 and the positive electrode-side power feeding terminal 44a of the power output terminal 20 without being routed via the voltage regulator 30. The relay 34 is a mechanical switching unit that includes a switch body 54 provided in the bypass line 32 and a coil 56 that electromagnetically switches the closing and opening of the switch body 54 in accordance with a relay connection signal Si3 (which will be described later). The coil 56 is configured so that one end is connected to the control unit 36 and the other end is connected to GND. The relay 34 can be latch-type or normally-closed type. The relay 34 switches the connection and disconnection of the bypass line 32. In this embodiment, the connection and disconnection of the bypass line 32 is switched by the relay 34. However, the relay 34 may be substituted with a MOS transistor.

Capacitors Ca and Cb are connected between the power input terminal 18 and the voltage regulator 30 (the input side of the voltage regulator 30) and between the voltage regulator 30 and the power output terminal 20 (the output side of the voltage regulator 30). The capacitors Ca and Cb prevent the oscillation of the voltage regulator 30.

The control unit 36 is a microcontroller having a CPU and a memory. The control unit 36 has a connection control unit 58, a time measurement unit 60, and a voltage supply control unit 62.

The time measurement unit 60 receives the second signal Si2 from the second signal generation unit 28. When the time measurement unit 60 receives the second signal Si2 having a High level, the time measurement unit 60 starts a timer count.

The time measurement unit 60 starts the timer count in accordance with the second signal Si2 outputted from the second signal generation unit 28. The time measurement unit 60 calculates a time determination value showing whether the time elapsed since the count start is longer than a predetermined time t1 set in advance and outputs a time determination value to the connection control unit 58 and the voltage supply control unit 62. The time determination value has a High level when the time elapsed since the count start is longer than the predetermined time t1 set in advance, and has a Low level when the time elapsed since the count start is shorter than the predetermined time.

The connection control unit 58 receives the first signal Si1 from the first signal generation unit 26. The connection control unit 58 outputs a relay connection signal Si3 to the coil 56 based on the first signal Si1 and the time determination value. When the relay connection signal Si3 has a High level, the coil 56 closes the switch body 54, and when the relay connection signal Si3 has a Low level the coil 56 opens the switch body 54.

Figure 3:
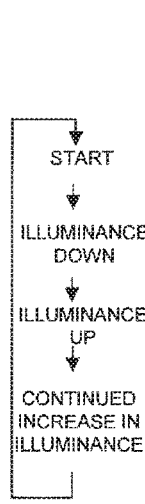
FIG. 3 illustrates the relation of an input signal and an output signal in the control unit of FIG. 1.

With reference to FIG. 3, the following section will describe the relation of an input signal and an output signal in the control unit 36. FIG. 3 illustrates the relation between an input signal and an output signal and a time determination value in the control unit 36. An input signal is the first signal Si1 and the second signal Si2. An output signal is a relay connection signal Si3 and an enable signal Si4. In FIG. 3, a High level is shown by "H" and a Low level is shown by "L".

At C1, the solar cell module 12 starts the electric power generation and a photoelectric conversion unit has an increased illuminance on the light-receiving face. As a result, the solar cell module 12 has the output voltage Vcell exceeding the predetermined voltage Va, thus resulting in the first signal Si1 having a High level. In this case, the second signal Si2 also has a High level. Since the time measurement unit 60 does not perform a count operation, the time determination value at this point of time has a Low level. In this case, the relay connection signal Si3 has a Low level and the enable signal Si4 has a High level, thus activating the voltage regulator 30. As a result, the relay 34 is in an OFF state and the current path (the bypass line 32)

is disconnected. In this case, the power output terminal 20 has a Reg voltage as an output Vout. The Reg voltage is a voltage adjusted by the voltage regulator 30.

When the power feeding apparatus 14 starts power supply, the output voltage Vcell of the solar cell module 12 decreases depending on the amount of current that can be received by the mobile terminal unit 16. Specifically, the current value prior to the start of the power supply by the power feeding apparatus 14 is 0 and the output voltage Vcell is the open voltage of the solar cell module 12. When the power feeding apparatus 14 starts power supply and the current value increases, then the output voltage Vcell decreases depending on the I-V characteristic of the solar cell module 12. Since the power feeding apparatus 14 continues power supply, the output voltage Vcell of the solar cell module 12 is further reduced. As a result, the first signal Si1 is switched from a High level to a Low level. Thereafter, the second signal Sit is also switched from a High level to a Low level. As a result, as shown by C2, the first signal Si1 has a Low level, the relay connection signal Si3 has a High level, and the relay 34 is turned ON. In this case, the power output terminal 20 has an output Vout equal to the input voltage Vcell. Although the enable signal Si4 may have any of a High level state or a Low level state, the enable signal Si4 has a High level in this case.

When the light-receiving face has a lowered illuminance and the solar cell module 12 has a reduced electric power generation capability, then both of the voltage and current outputted from the power feeding apparatus 14 decline. In this case, the respective signals Si1 to S14 have states that are the same as the one shown in C2.

Next, at C3, the light-receiving face has an increased illuminance and the second signal Sit is switched from a Low level to a High level. In this case, the time measurement unit 60 starts the count operation in accordance with switching of the second signal Sit. Until the time measurement unit 60 has a count value exceeding a predetermined time t1 set in advance, at least one of the relay connection signal Si3 and the enable signal Si4 is maintained at a High level. Whether the power feeding apparatus 14 supplies power via the bypass line 32 or via the voltage regulator 30 is determined based on the result of comparing the input voltage Vcell with the predetermined voltage Va. In this case, the relay connection signal Si3 and the enable signal Si4 are both at a High level, the relay 34 is turned ON, and the voltage regulator 30 is activated. At C3, when the second signal Sit changes from a High level to a Low level during the count operation by the time measurement unit 60, the time measurement unit 60 stops the count operation and resets the count value and the processing returns to the state of C2.

Next, at C4, when the continued count operation by the time measurement unit 60 consequently causes the count value to be higher than the predetermined time t1 set in advance, then the time determination value is switched from a Low level to a High level. In this case, the relay connection signal Si3 and the enable signal Si4 are both at a Low level, the relay 34 is turned OFF, and the voltage regulator 30 is in a deactivated state. Specifically, at C4, the power feeding apparatus 14 temporarily stops the charging of the mobile terminal unit 16.

Next, at C5, when the predetermined time has passed since the stoppage of the charging by the power feeding apparatus 14, the enable signal Si4 is switched from a Low level to a High level and the count value of the time measurement unit 60 is reset. This means that the processing returns to C1. Thus, the voltage regulator 30 resumes the voltage adjustment of the input voltage Vin to send the adjusted voltage to the power output terminal 20.

The operation as described above is realized by constituting the connection control unit 58 and the voltage supply control unit 62 in the manner as described below. First, when the first signal Si1 inputted to the connection control unit 58 is at a High level or when the time determination value is switched from a Low level to a High level, the connection control unit 58 outputs the relay connection signal Si3 having a Low level to correspond to C1 and C4 of FIG. 3, respectively. As a result, the bypass line 32 is disconnected by the switch body 54 of the relay 34.

When the first signal Si1 inputted to the connection control unit 58 is at a Low level and the time determination value has a Low level on the other hand, the relay connection signal Si3 outputted from the connection control unit 58 has a High level to correspond to C2 and C3 of FIG. 3. As a result, the bypass line 32 is connected by the relay 34. In this manner, a bypass operation is carried out that is controlled so that the input voltage Vcell is outputted from the power output terminal 20. This will be described later.

When the first signal Si1 inputted to the connection control unit 58 is at a High level and the time determination value has a Low level, or when the predetermined time has passed since the change of the time determination value from a Low level to a High level, in accordance with C1 and C5 of FIG. 3, the voltage supply control unit 62 outputs the enable signal Si4 having a High level to the enable terminal EN. As a result, the voltage adjustment is executed by the voltage regulator 30.

When the time determination value changes from a Low level to a High level, on the other hand, in accordance with C4 of FIG. 3, the voltage supply control unit 62 causes the relay connection signal Si3 and the enable signal Si4 to be at a Low level over the predetermined time Tr for the purpose of resetting. For example, when the time having passed since the start of the count by the time measurement unit 60 is equal to or longer than the predetermined time t1 (e.g., 10 seconds), the relay connection signal Si3 and the enable signal Si4 are caused to be at a Low level over the predetermined time Tr for the purpose of resetting (e.g., 1 second).

As a result, the execution of the voltage adjustment by the voltage regulator 30 and the power supply via the bypass line 32 are stopped over the short predetermined time Tr for the purpose of resetting, thus causing the output current of the output terminal 50 to be 0 over a short time. By stopping the execution of the voltage adjustment over a short time, the operation of the power feeding apparatus 14 is stopped to stop the current output from the power output terminal 20. This may consequently increase the charging efficiency of the mobile terminal unit 16 when the power generated from the solar cell module 12 is used to charge the machine-side secondary battery 22 in the mobile terminal unit 16. This will be described in detail later.

The functions of the respective sections 58, 60, and 62 of the control unit 36 as described above can be realized by hardware or by allowing a CPU to execute a program stored in a storage device such as a memory. For example, the connection control unit 58 can be configured to include an NOR circuit and the time measurement unit 60 can be configured to include a timer circuit.

When the input voltage Vcell is equal to or lower than the predetermined voltage Va, the power feeding apparatus 14 and the solar cell system 10 having a configuration as described above connect the bypass line 32 by the relay 34 to output the input voltage Vcell to the power output terminal 20. This can consequently suppress the loss generation in the voltage regulator 30 to effectively use the power generated from the solar cell module 12 and thereby output the power from the power output terminal 20.

Next, with reference to the flowchart of FIG. 4, a method will be described to control the execution and stoppage of the charging of the mobile terminal unit 16 in the power feeding apparatus 14. The flowchart of FIG. 4 can be executed by a program stored in a storage unit. The power feeding apparatus may have another configuration in which another program corresponding to a method of controlling the opening and closing of the relay 34 depending on the first signal Si1 can be executed in parallel with the program corresponding to FIG. 4. For example, when Si1 is at a Low level, the relay connection signal Si3 is caused to be at a High level. When Si1 is at a High level, a program for causing the relay connection signal Si3 to be at a Lo level is executed in parallel with the program corresponding to FIG. 4. When Si1 is at a Low level, the enable signal Si4 is caused to be at a Low level. When Si1 is at a High level, the program for causing the enable signal Si4 to be at a High level can also be executed in parallel with the program corresponding to FIG. 4.

First, in Step S10 (hereinafter simply referred to as "S"), it is determined whether or not the second signal Si2 inputted from the second signal generation unit 28 is at a Low level (i.e. whether the input voltage Vcell is equal to or lower than the second predetermined voltage Vreset). When S10 shows that the second signal Si2 is not at a Low level, the processing is completed and returns to S10. When the second signal Si2 is at a Low level on the other hand, it is then determined whether the second signal Si2 changes to a High level or not (S11). When the second signal Si2 changes to a High level, then a timer count is performed as a count operation (S12). An operation to reset the count value of the time measurement unit 60 is not shown in FIG. 4. However, this operation may also be performed when the input voltage Vcell has a low value (specifically, when the second signal Si2 is in a Low level status), for example.

In S13, when the time measurement unit 60 determines that the second signal S12 in a High level state continues over the time t1 or more, the calculated time determination value changes from a Low level to a High level and the processing proceeds to S14.

When the second signal S12 in a High level state does not continue over the time t1 or more in S13 on the other hand (e.g., when the second signal Si2 changes from a High level to a Low level within a period shorter than the time t1), the processing returns to S11 while the calculated time determination value is at a Low level. In this case, the count value of the time measurement unit 60 is reset.

In S14, the voltage supply control unit 62 causes the enable signal Si4 outputted to the enable terminal EN of the voltage regulator 30 to be at a Low level over the predetermined time Tr for the purpose of resetting. In this case, in accordance with C4 of FIG. 3, even when the first signal Si1 is at any of a Low level or a High level, the connection control unit 58 causes the relay connection signal Si3 to be at a Lo level to disconnect the bypass line 32 by the relay 34. When the control of the relay connection is being executed by another program, this other program is interrupted to block the bypass line 32. This consequently changes the output current of the power output terminal 20 to 0 over the predetermined time Tr for the purpose of resetting.

Next, in S15, the voltage supply control unit 62 outputs the enable signal Si4 having a High level to the enable terminal EN of the voltage regulator 30. As a result, the voltage adjustment by the voltage regulator 30 is executed or resumed. The output from the power output terminal 20 is a Reg output as an adjusted output. After the processing in S15, the processing returns to S10 again.

Figure 5:
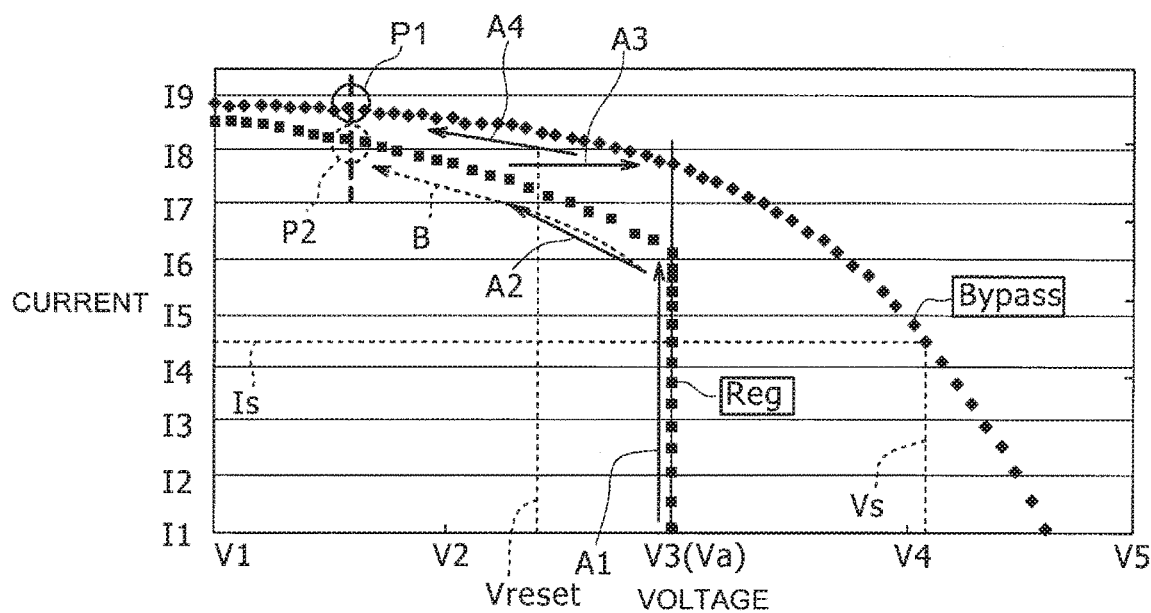
FIG. 5 illustrates the relation between the output voltage and the output current outputted to a power output terminal of a power feeding apparatus and the output power of a solar cell module in an embodiment.

Next, with reference to FIG. 5, the following section will describe the "operation sequence" of the power feeding apparatus 14. FIG. 5 illustrates the relation between an output voltage and an output current outputted to the power output terminal 20 of the power feeding apparatus 14 and the output power of the solar cell module 12 when the solar cell module 12 including eight serially-connected solar cells 38 is irradiated with predetermined light as shown in FIG. 2.

In FIG. 5, the voltage, current, and power values are denoted by V1, V2, . . . , I1, I2 . . . , P1, P2 . . . . For example, the voltage V3 is 5.0V. In FIG. 5, the diamond shape shown by "Bypass" represents the relation between the output voltage and the output current when the bypass line 32 is connected by the relay 34 and the input voltage Vcell is outputted to the power output terminal 20 without being routed to the voltage regulator 30. This relation is substantially the same as the relation between current and voltage outputted from the solar cell module 12. The square shown by "Reg" represents the relation between the output voltage and output current when the bypass line 32 is disconnected by the relay 34 and the voltage adjustment is executed by the voltage regulator 30. As can be seen from FIG. 5, the voltage adjustment by the voltage regulator 30 causes the occurrence of a voltage loss and a current loss. In other words, the input voltage Vcell can be outputted to the power output terminal 20 without being routed to the voltage regulator 30, thereby reducing the voltage loss and current loss in the circuit.

The "bypass operation" by the connection of the relay 34 is executed in the manner as described below. First, when the mobile terminal unit 16 is connected to the solar cell system 10, the voltage at the solar cell module 12-side is higher than the predetermined voltage at the power output terminal 20 side until output current flows from the power output terminal 20 to the mobile terminal unit 16. When the input voltage Vcell is higher than the predetermined voltage Va in this state, the relay 34 is opened. Thus, no bypass operation is performed and the input voltage Vcell is adjusted by being reduced by the voltage regulator 30. When current flows from the power output terminal 20 to the mobile terminal unit 16, as shown by the arrow Ai in FIG. 5, the operation point changes along the I-V characteristic line for the voltage adjustment of the voltage regulator 30 and the output current increases while maintaining the output voltage Vout at the adjusted predetermined voltage V3.

When current flows from the power output terminal 20 to the mobile terminal unit 16, as shown by the arrow A2 in FIG. 5, the voltage of the solar cell module 12 declines to a value equal to or lower than the predetermined voltage Va. In this case, the relay 34 is closed and the bypass operation is executed and the operation point changes, as shown by the arrow A3. As shown by the arrow A4, the current value increases along the I-V characteristic line when the bypass line 32 is connected by the relay 34. Then, charging is performed at the operation point surrounded by the circle PI shown by the solid line at which the I-V characteristic owned by the solar cell module 12 matches the I-V characteristic shown by the charging characteristic of the mobile terminal unit 16.

On the other hand, in the case of the configuration of a comparative example in which no bypass operation is executed even when the output voltage is lower than the predetermined voltage Va, the current value increases along the I-V characteristic line of the low current value as shown by the broken line arrow B. The charging operation is stably executed at the operation point surrounded by the circle P2 shown by the broken line at which the I-V characteristic possessed by the solar cell module 12 matches the I-V characteristic shown by the charging characteristic of the mobile terminal unit 16. The voltage at the circle P1 is higher compared to the voltage at the circle P2. However, the difference between the two voltages is very small. As can be seen from the comparison between the operation points P1 and P2 of FIG. 5, the output current in the embodiment can be higher than that of the comparison example.

Next, the following section will describe the "reset operation" that is performed, when predetermined conditions are established, to set the output voltage Vout to 0 over the predetermined time Tr for the purpose of resetting and to stop the current output over the time Tr. The "reset operation" is performed in order to increase the efficiency at which the machine-side secondary battery 22 is charged. Specifically, when the solar cell module 12 is used to charge the machine-side secondary battery 22, direct sunlight may be blocked by cloud or a barrier from reaching the light-receiving face of the photoelectric conversion unit of the solar cell module 12. In this case, the light-receiving face may have a lower illuminance to cause reduced supply current.

On the other hand, when a decrease of the charging-side supply capability causes the input current to the mobile terminal unit 16 to be equal to or lower than a predetermined value, even when the charging-side supply capability subsequently increases, the mobile terminal unit 16 may have a function to limit the upper limit of input current during charging to a current value lower than that in the initial state. In this case, even when the weather improves, for example, and the illuminance recovers, the charging input current may be limited to a current value lower than that of the initial status.

In this embodiment, when the charging current is limited, an increase in the electric power generation capability causes a proportional increase in the input voltage Vcell. Thus, when the predetermined time t1 has passed since the input voltage Vcell was higher than the second predetermined voltage Vreset, the reset operation is performed to stop the current output from the power output terminal 20 over the predetermined time Tr for the purpose of resetting. As a result, the charging operation is reset after the reset operation in the mobile terminal unit 16. Thus, the initial state is returned to again and charging is started. Whether the illuminance is increased and the electric power generation capability is sufficient or not can be determined based on the input voltage Vcell of the power feeding apparatus 14. In this embodiment, by performing the reset operation as described above, the input current during the charging of the mobile terminal unit 16 can be recovered to have a high value in the initial state to improve the charging efficiency of the mobile terminal unit 16. In other words, by performing the reset operation, the charging efficiency can be improved when the power generated from a solar cell is used to charge a secondary battery in a to-be-charged machine that has a function to limit the upper limit of the charging current to a value lower than the one in the initial state if the charging current declines to a value equal to or lower than a predetermined value.

With reference to FIG. 5, the following section will describe the reset operation. There may be a case in which light emitted to the solar cell module 12 declines to cause lower generated power, which may cause the current outputted from the power output terminal 20 to be equal to or lower than Is of FIG. 5. In this case, the mobile terminal unit 16 may limit the subsequent input current to Is. In order to charge the mobile terminal unit 16 as described above, even when the illuminance at the light-receiving face is recovered, the input current to the mobile terminal unit 16 is limited to Is and the input voltage Vcell of the power feeding apparatus 14 increases to V4. In this case, when the state Vs, in which the input voltage Vcell of the power feeding apparatus 14 is higher than the second predetermined voltage Vreset, continues over the predetermined time, for example, the reset operation is performed to set the current outputted from the power feeding terminal 44a of the positive electrode of the power output terminal 20 to zero over the predetermined time Tr for the purpose of resetting. As a result, when the mobile terminal unit 16 has a function to limit the input current flowing therein to a value equal to or lower than Is, the limitation on the input current of the mobile terminal unit 16 is cancelled, thereby returning to the charging operation in the initial state. Thus, a bypass operation is performed and the operation point during charging moves to the point surrounded by the circle P1 shown by the solid line.

There may be another case in which current flowing into the mobile terminal unit 16 is limited while the bypass operation is being executed. For example, even when the mobile terminal unit 16 regulates the input current during charging at the operation point corresponding to the high voltage side than Vreset of the arrow A4 on the I-V characteristic line of Bypass, the input voltage Vcell may be higher than the second predetermined voltage Vreset, and this state continues over a period equal to or longer than the predetermined time, thereby the reset operation is performed, as in the above case, and the operation point during charging moves to the point surrounded by the circle P1.

Figure 4:
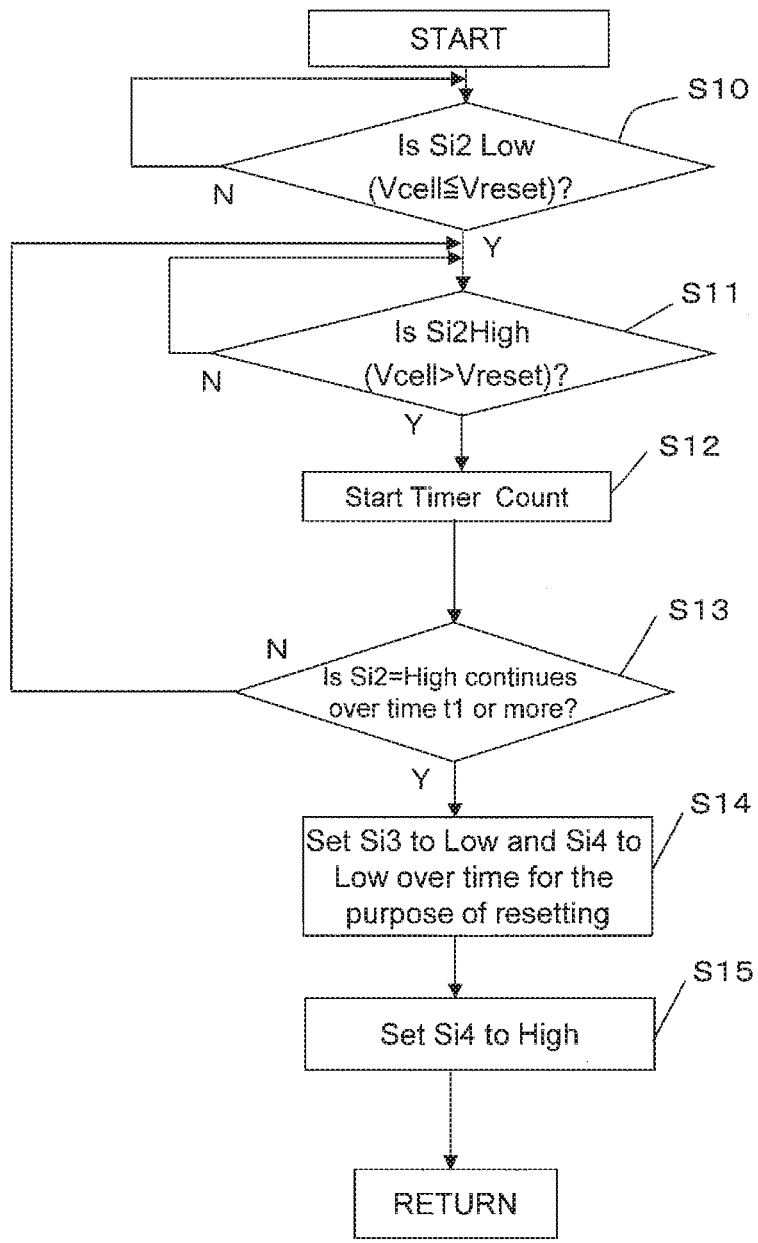
FIG. 4 is a flowchart illustrating a method of controlling the execution and stoppage of charging to a mobile terminal unit 16 in an embodiment.

In FIG. 4, when the second signal Sit changes from a Low level to a High level, the time measurement unit 60 starts the count operation. The configuration as described above can prevent the situation in which a reset operation is performed when the mobile terminal unit 16 is controlled to be charged at a low current value regardless of the output of the solar cell module.

According to the above power feeding apparatus 14 and solar cell system 10, when the input voltage Vcell is equal to or lower than the predetermined voltage Va, the bypass line 32 is connected by the relay 34. Thus, the voltage is not adjusted by the voltage regulator 30, thereby suppressing the power loss in the circuit. Furthermore, the voltage regulator 30 adjusts the voltage to have a value equal to or lower than the predetermined voltage and outputs the adjusted voltage from the power output terminal 20. Thus, there is no need to adjust the voltage if the input voltage Vcell is equal to or lower than the predetermined voltage Va. Thus, the charging voltage can be adjusted to a value equal to or lower than the predetermined value and the power generated from the solar cell module 12 can be effectively used to output the charging power from the power output terminal 20.

In the embodiment, a decrease in the output voltage of the solar cell module 12 is detected by the first signal generation unit 26. The control unit 36 is used to close the relay 34 so that the input voltage Vcell is outputted to the power output terminal 20 without being routed to the voltage regulator 30. As a result, the mobile terminal unit 16 can be directly connected to the output of the solar cell module 12, thus reducing the circuit loss. Furthermore, as shown in FIG. 5, the solar cell module 12 can be driven by a higher current side, thus improving the charging capability. A secondary battery such as a lithium-ion battery or a nickel hydride battery is charged with a charge amount determined based on the product of current and time, and voltage is not directly related to the charge amount.

Figure 6:
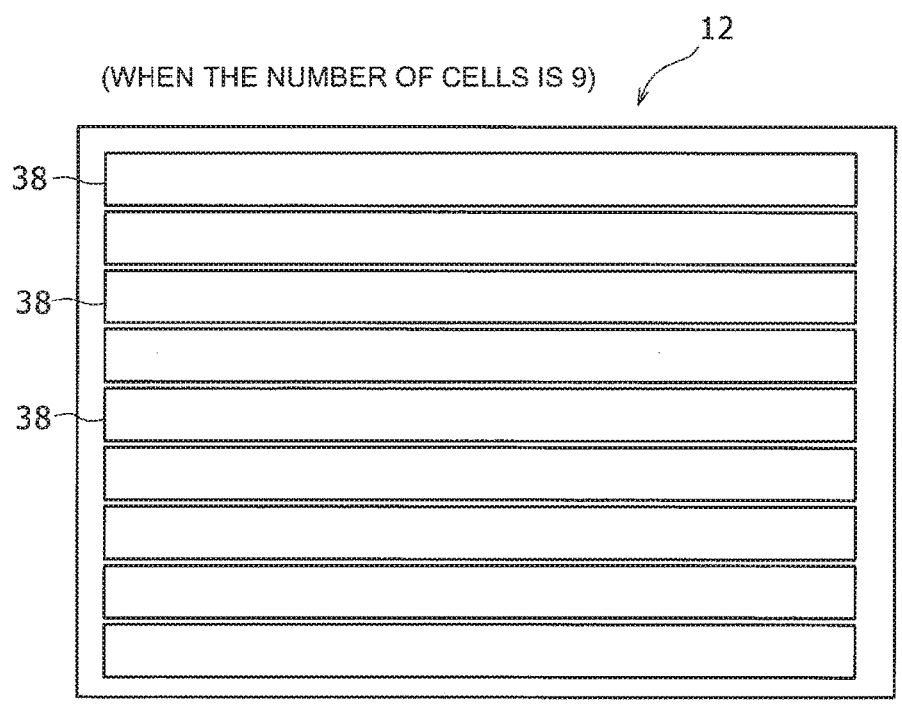
FIG. 6 illustrates another example of the solar cell module in an embodiment.

In the comparison example in which the bypass operation of the voltage regulator 30 is not performed, the voltage loss increases compared with the case of the embodiment. The electric power generation voltage increases with an increase in "the number of serially-connected cells", which is the number of serially-connected solar cells 38 in the solar cell module 12. In the comparison example, since the voltage is outputted via the voltage regulator, the number of serially-connected cells is increased in consideration of the voltage loss due to the voltage regulator. Thus, the charging operation can be stably performed even when a change in the amount of light received by the solar cell module 12 causes a change in the electric power generation voltage. However, when solar cells are arranged within a fixed area, an increase in the number of serially-connected cells cause a reduction of the area of one solar cell, thus reducing the electric power generation current. Thus, this embodiment can reduce "the number of serially-connected cells" having an influence on the reduction of the electric power generation current. Specifically, the number of serially-connected cells is 8 as shown in FIG. 5. In the comparison example, in order to obtain an equal output voltage, the number of serially-connected cells must be 9 as shown in FIG. 6. Thus, when the electric power generation area of the entire solar cell module 12 is constant, 8 serially-connected cells can increase the area of each cell more than in the case of 9 serially-connected cells, thus increasing the short-circuit current of the solar cell 38. Furthermore, since the number of serially-connected cells can be reduced, the number of spaces among cells can be reduced from 8 to 7, thus providing an improved space efficiency. This can consequently further improve the charging capability using the solar cell module 12.

Figure 7:
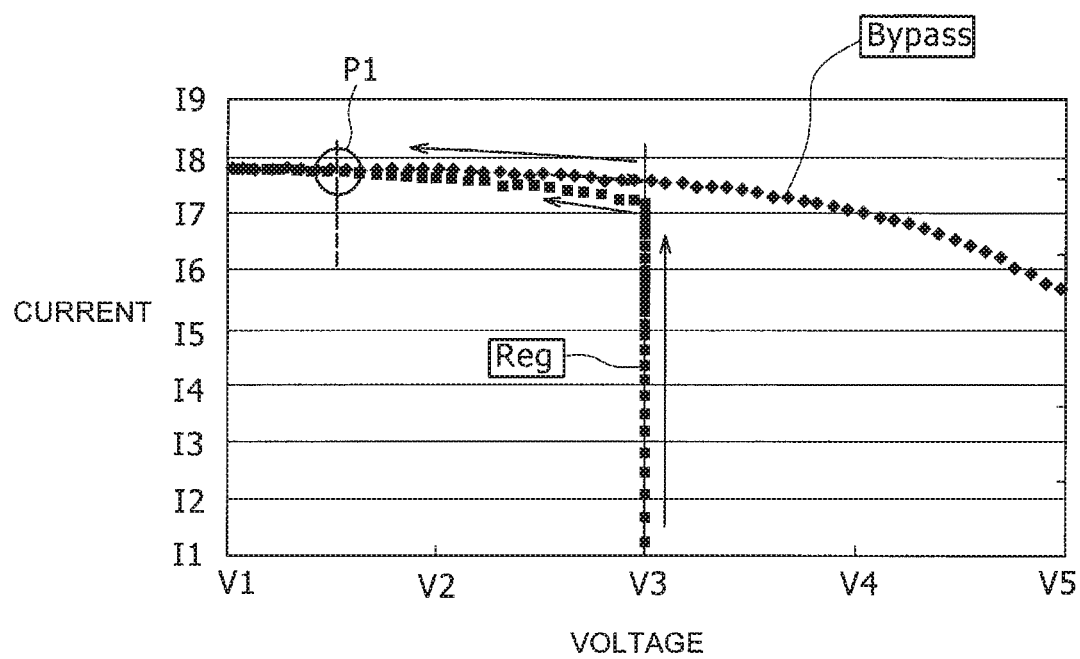
FIG. 7 is a diagram corresponding to FIG. 5 in which the power feeding apparatus is connected to the solar cell module of FIG. 6 in an embodiment.

FIG. 7 is a diagram corresponding to FIG. 5 when the power feeding apparatus 14 is connected to the solar cell module 12 of FIG. 6. As can be seen from the comparison between FIG. 5 and FIG. 7, the 8 serially-connected cells shown in FIG. 5 can provide increased output current compared with the case of the 9 serially-connected cells shown in FIG. 6. The charging output can be significantly improved by the combination of the bypass effect obtained by allowing the input voltage Vcell to be outputted to the power output terminal 20 without being routed via the voltage regulator 30, and the reduced number of serially-connected cells of the solar cell module 12, for example. The embodiment using the solar cell module 12 of FIG. 2 can increase the charging output by about 20% at maximum compared with the case of the comparison example using the solar cell module 12 of FIG. 6.

The relay 34 is a latch type or normally-closed type in FIG. 1, so power for closing the relay 34 during the bypass operation is not required, thus reducing the loss during the bypass operation.

The control unit 36 may be configured so that a decrease in the input voltage Vcell causes, during the above-described reset operation, a proportional increase in the predetermined time t1 to determine whether or not the output from the power output terminal 20 can be blocked. This configuration can provide a longer time required to start the reset operation when the input voltage Vcell is small. This can consequently prevent the reset operation from being frequently carried out. This can reduce the loss during charging due to a reduced charging time, thus improving the charging efficiency.

[Second Embodiment]

Figure 8:
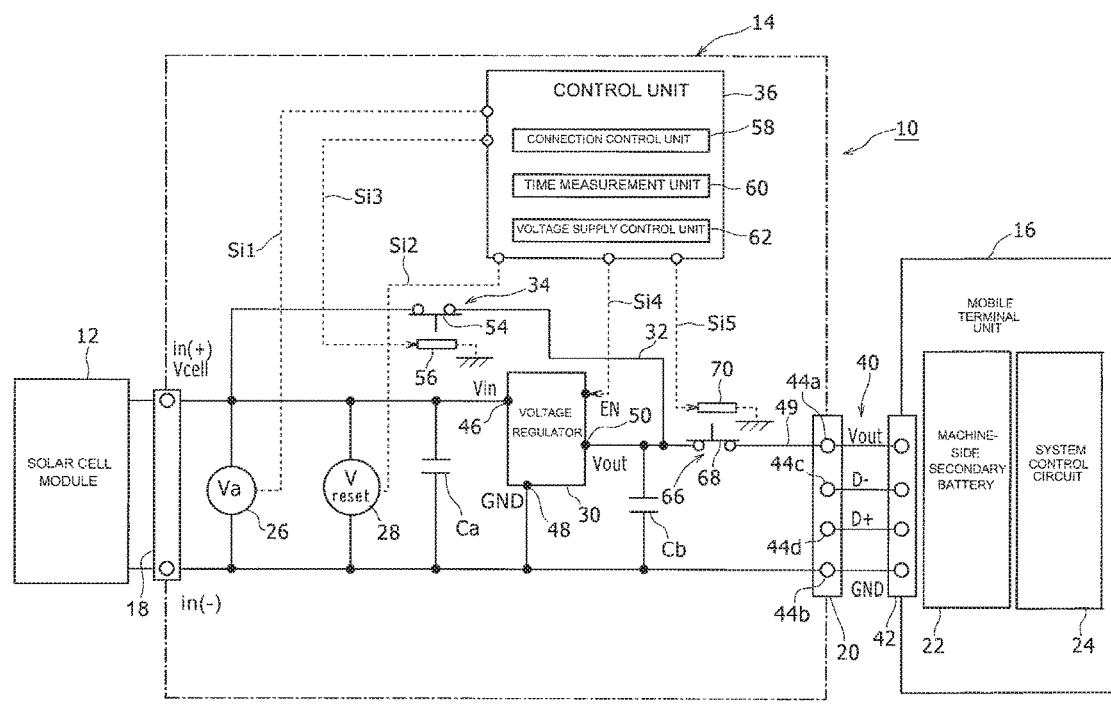
FIG. 8 is a diagram corresponding to FIG. 1 in another example of the embodiment.

FIG. 8 is a diagram of this embodiment, and corresponds to FIG. 1. The power feeding apparatus 14 is configured to include the second relay 66 provided in the output line 49 connected between the output terminal 50 and the power output terminal 20. The second relay 66 has a switch body 68 and a coil 70. The switch body 68 is provided in the output line 49. The second relay 66 is the second switching unit that switches the connection and disconnection of the output line 49. The second relay 66 is closed when no reset operation is performed. The second relay 66 can be the normally-closed type.

The voltage supply control unit 62 that is part of the control unit 36 is configured, when the predetermined time t1 has passed since the input voltage Vcell of the power input terminal 18 exceeding the second predetermined voltage Vreset, to output the relay disconnection signal Si5 of a Low level or a High level to the coil 70 to control the output line 49 to be disconnected by the second relay 66 over the predetermined time Tr for the purpose of resetting. This case is similar to the first embodiment in that the current output from the power output terminal 20 is stopped by the second relay 66 over the predetermined time Tr for the purpose of resetting. In contrast with the case of the first embodiment, the voltage supply control unit 62 does not have a function to set the enable signal Si4 outputted to the enable terminal EN to a Low level under the same conditions for performing a reset operation. The other configurations and actions are the same as those of the first embodiment.

[Third Embodiment]

Figure 9:
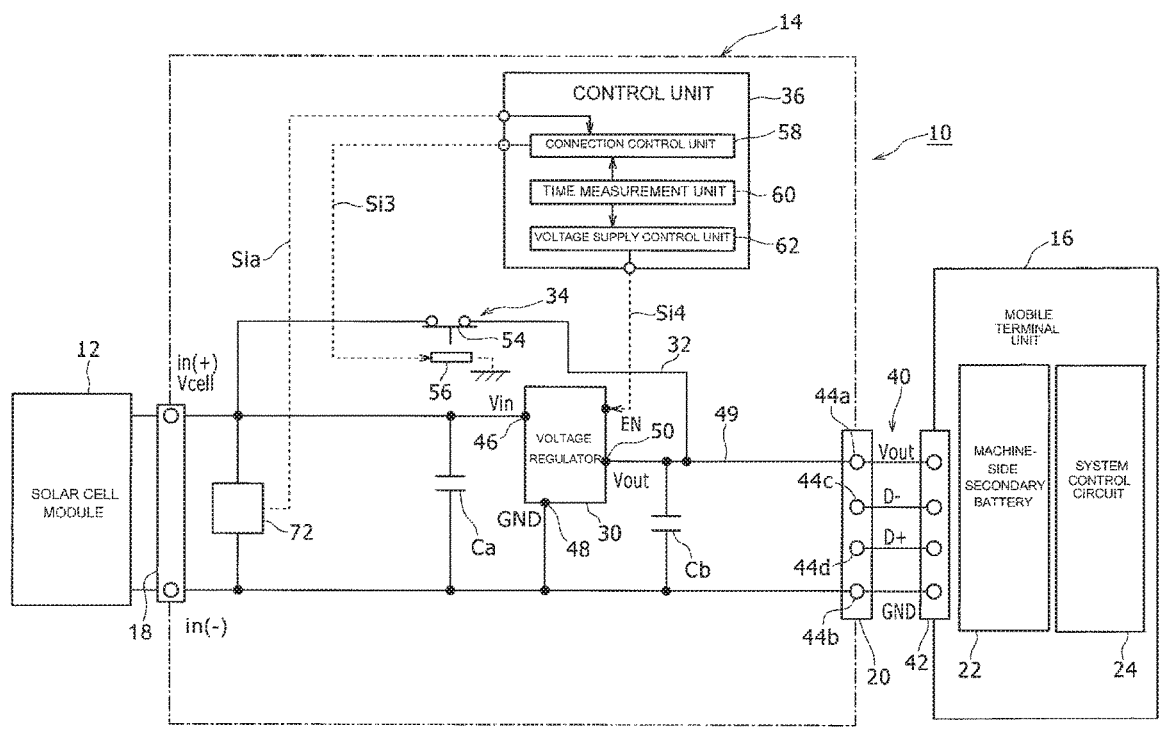
FIG. 9 is a diagram corresponding to FIG. 1 in another example of the embodiment.

FIG. 9 is a diagram of this embodiment, and corresponds to FIG. 1. The power feeding apparatus 14 is configured so that the first signal generation unit 26 and the second signal generation unit 28 are substituted with a voltage sensor 72 that is a voltage detection unit for detecting the input voltage Vcell inputted to the power input terminal 18. The voltage sensor 72 outputs, to the control unit 36, a signal showing the detection voltage Vcell as the first signal Sia.

The connection control unit 58 controls the relay 34 to open when the detection voltage Vcell represented by the first signal Sia is higher than the predetermined voltage Va. The voltage supply control unit 62 controls the voltage regulator 30 to perform a voltage adjustment when the detection voltage Vcell is higher than the second predetermined voltage Vreset which is equal to or lower than the predetermined voltage Va. When the first signal Sia is an analog signal, the control unit 36 uses an AD converter, for example, to convert the analog value represented by the first signal Si to a digital value. The digital value is compared with the predetermined voltage Va and the second predetermined voltage Vreset retained by the control unit 36 to control the opening and closing of the relay 34 and the voltage adjustment operation.

The time measurement unit 60 determines whether the predetermined time t1 has passed or not since the detection voltage Vcell exceeded the second predetermined voltage Vreset. When the time measurement unit 60 determines that the predetermined time t1 has passed, the voltage supply control unit 62 sets the relay connection signal Si3 and the enable signal Si4 to a Low level over the predetermined time Tr for the purpose of resetting, to thereby stop the current output from the power output terminal 20 over the predetermined time Tr for the purpose of resetting.

The configuration as described above also can provide the same effect as that of the first embodiment. A configuration to stop the current output from the power output terminal 20 over the predetermined time Tr for the purpose of resetting may also be provided as in the above configuration shown in FIG. 8 in which the output line 49 includes the second relay and the second relay is opened during a reset operation. The other configurations and actions are the same as those of the first embodiment or the second embodiment.

[Fourth Embodiment]

Figure 10:
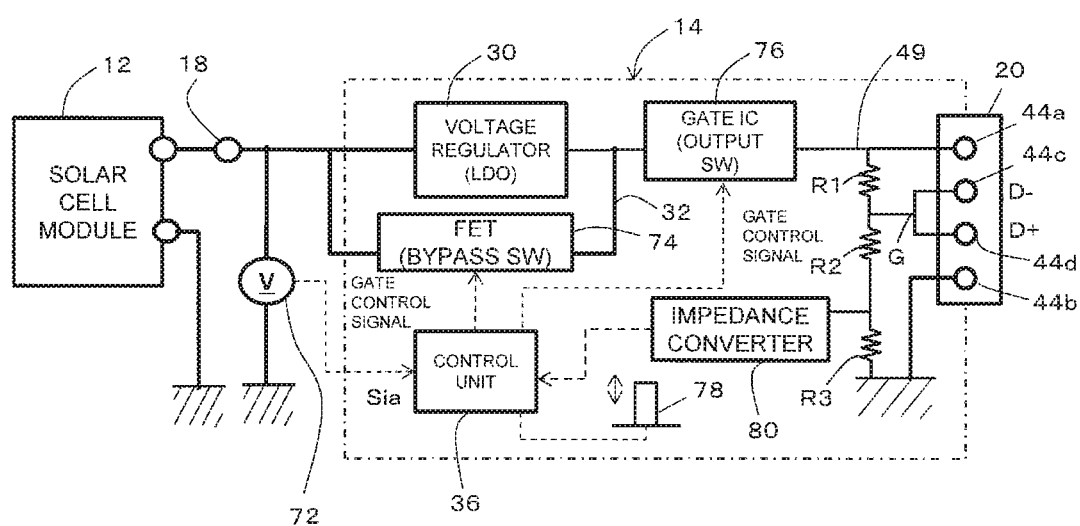
FIG. 10 is a diagram corresponding to FIG. 1 in another example of the embodiment.

FIG. 10 is a schematic view of this embodiment, and corresponds to FIG. 1. The power feeding apparatus 14 includes the voltage sensor 72 for detecting the input voltage Vcell inputted to the power input terminal 18, an FET 74 as a switching element provided between the power input terminal 18 and the power output terminal 20 without being routed via the voltage regulator 30, an gate IC 76 connected among the FET 74, the voltage regulator 30, and the power output terminal 20, and a manual reset SW 78 as a manual reset operation unit.

The voltage sensor 72 outputs, to the control unit 36, a signal showing the detection value of the input voltage Vcell as the first signal Sia. The FET 74 is provided as a switching unit instead of the relay 34 (FIG. 1) and is an MOSFET for example. The FET 74 is controlled by a gate control signal outputted from the control unit 36. The FET also may be substituted with another switching element.

The gate IC 76 is the second switching unit and has a function to switch the connection and disconnection of the output line 49 to thereby switch the execution and stoppage of the current output from the output terminal 20. The gate IC 76 is controlled by a gate control signal outputted from the control unit 36. The gate IC 76 also has a function to prevent countercurrent from flowing from the output terminal 20 side to the input terminal 18 side. This can consequently prevent the mobile terminal unit 16 (see FIG. 1) as a to-be-charged machine from discharging current to the solar cell module 12, even when power generated from the solar cell module 12 is zero, such as at night, for example. The gate IC 76 can also be substituted with an FET for which the ON/OFF status is controlled by the control unit 36. By configuring the second switching unit by the gate IC 76 or an FET, a need to connect the second switching unit to a diode to have a function to prevent countercurrent can be eliminated, thereby reducing the power loss in a normal situation. When the voltage regulator 30 includes an FET, for example, and has a function to prevent countercurrent, the gate IC 76 can be substituted with the second switching unit that does not have a function to prevent countercurrent, or the second switching unit can be omitted. In the following description, the FET will be denoted as "bypass SW", the voltage regulator will be denoted as "LDO", and the gate IC will be denoted as "output SW".

The control unit 36 is configured, when Va+0.1 (V) or more is established (Vcell≥va+0.1(V)) is established, as when the detection value of the input voltage Vcell is higher than the predetermined voltage Va (e.g., 5.0V), to control the bypass SW 74 to disconnect the bypass line 32 and, when the detection value of input voltage Vcell is equal to or lower than the predetermined voltage Va (Vcell≤va), to use the bypass SW 74 to connect the bypass line 32. 0.1V is a value that provides hysteresis to Va and will be described later.

The control unit 36 is also configured, when a predetermined time has passed after the detection value of the input voltage Vcell is equal to or lower than the second predetermined voltage Vreset (Vcell≤Vreset) and is then higher than the second predetermined voltage Vreset (Vcell>Vreset), to use the output SW 76 to disconnect the output line 49 over the predetermined time Tr for the purpose of resetting. In this manner, the control unit 36 performs the reset operation to stop the current output from the power output terminal 20.

The manual reset switch 78 is a reset operation unit and is an input/output device operated by a user. The following section will describe a case where the manual reset switch 78 is a depression button. However, the manual reset switch 78 may be another switch such as a toggle switch. The manual reset switch 78 is configured, when depressed by a user, to send a signal representing the operation to the control unit 36. The manual reset switch 78 causes the reset operation to be performed based on a user operation and changes the second predetermined voltage Vreset to a voltage that is higher by a predetermined voltage ΔV than the acquired voltage of the input voltage VcellA at the predetermined point of time. In the following section, the manual reset switch 78 will be denoted as a manual reset SW.

The signal terminals 44c and 44d of the power output terminal 20 are short-circuited at the connection point G. The positive electrode power feeding terminal 44a and the negative electrode power feeding terminal have therebetween the positive electrode side of three serially-connected resistances R1, R2, and R3. Two resistances R1 and R2 provided at the middle have therebetween the connection point G. The respective resistances R1, R2, and R3 have a high resistance value of about some MΩ. The resistances R2 and R3 positioned at the middle and the negative electrode side of the three resistances R1, R2, and R3 have therebetween an input terminal of the impedance converter 80. The impedance converter 80 includes an OP amplifier having a feedback factor=1 and the output terminal is connected to the control unit 36. As a result, the potential of one signal terminal of the signal terminals 44c and 44d (e.g., the terminal 44c of D−) is detected at a high accuracy. A detection signal showing the potential thereof is sent to the control unit 36. The power input terminal 18 and the voltage regulator 30 have therebetween a second voltage regulator (not shown). A voltage regulated by the second voltage regulator to have a predetermined voltage or less is inputted to the OP amplifier of the impedance converter 80.

A fuse or a PTC thermistor for limiting abnormal current may also be connected between the power input terminal 18 and the voltage regulator 30, and to the output line 49. A safety apparatus for turning OFF the bypass SW 74 by the control unit 36 may be provided when an excessively-high voltage is inputted to the power input terminal 18.

According to the fourth embodiment, in order to provide a stable reset operation without being significantly influenced by the charging characteristic of the mobile terminal unit 16 and the output characteristic of the solar cell module 12, the control unit 36 changes the second predetermined voltage Vreset as a reference voltage for stopping the current output from the power output terminal 20 depending on the acquired voltage of the input voltage Vcell. More specifically, in the initial state, the control unit 36 sets the initial value V0 set to the second predetermined voltage Vreset in advance (Vreset=V0). On the other hand, the control unit 36 detects and acquires, as an acquired voltage, the input voltage VcellA when the current output from the power output terminal 20 is stopped (i.e., when the predetermined estimated stable time Tstable set in advance has passed since the start of the reset operation). Then, after the initial reset operation is performed, the control unit 36 changes the second predetermined voltage Vreset to a voltage higher than the acquired voltage VcellA by the predetermined voltage Δ (Vreset=VcellA+ΔV).

Figure 11:
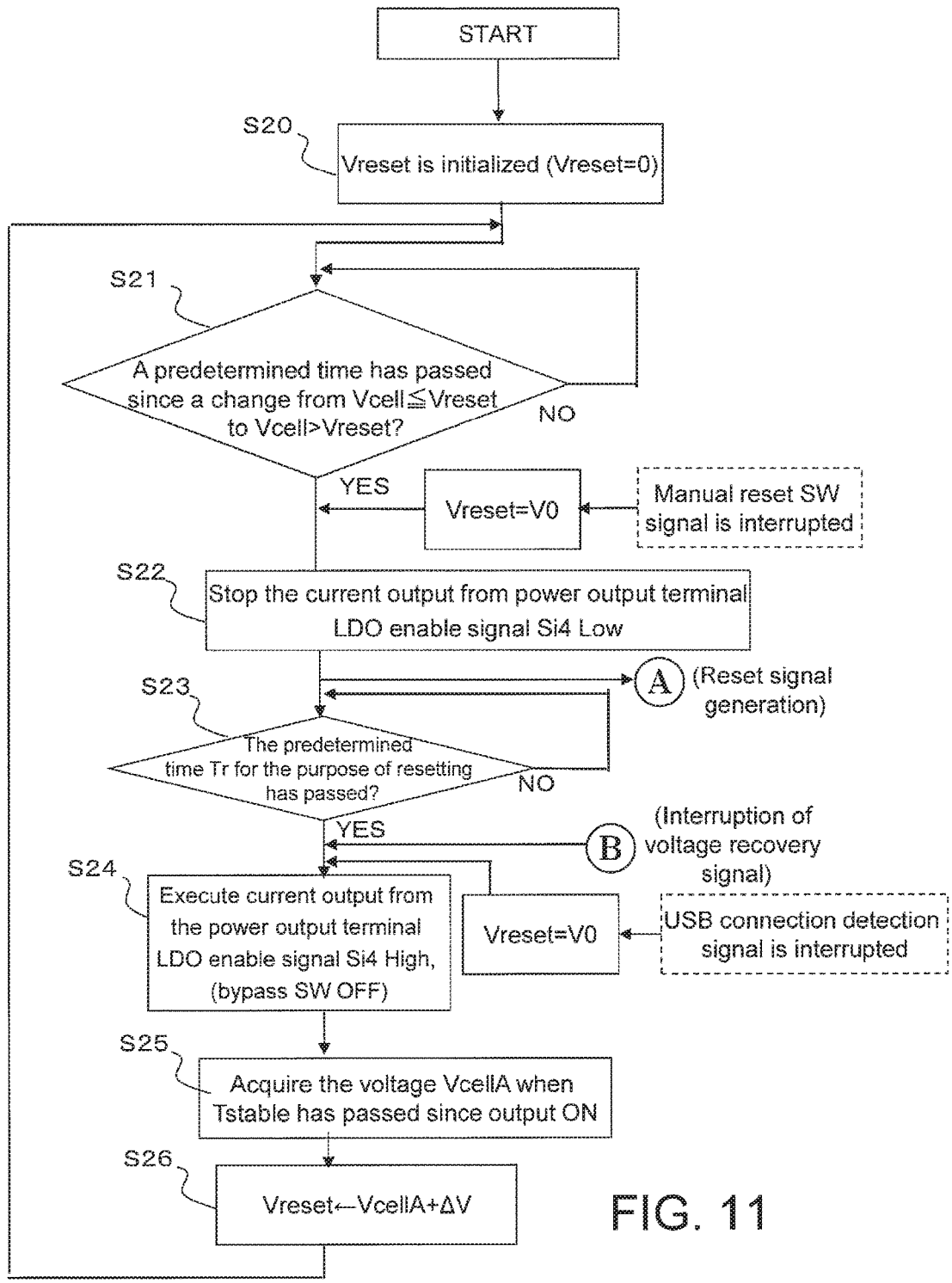
FIG. 11 is a flowchart illustrating a method of switching the execution and stoppage of current output to a mobile terminal unit in another example of the embodiment.
Figure 12:
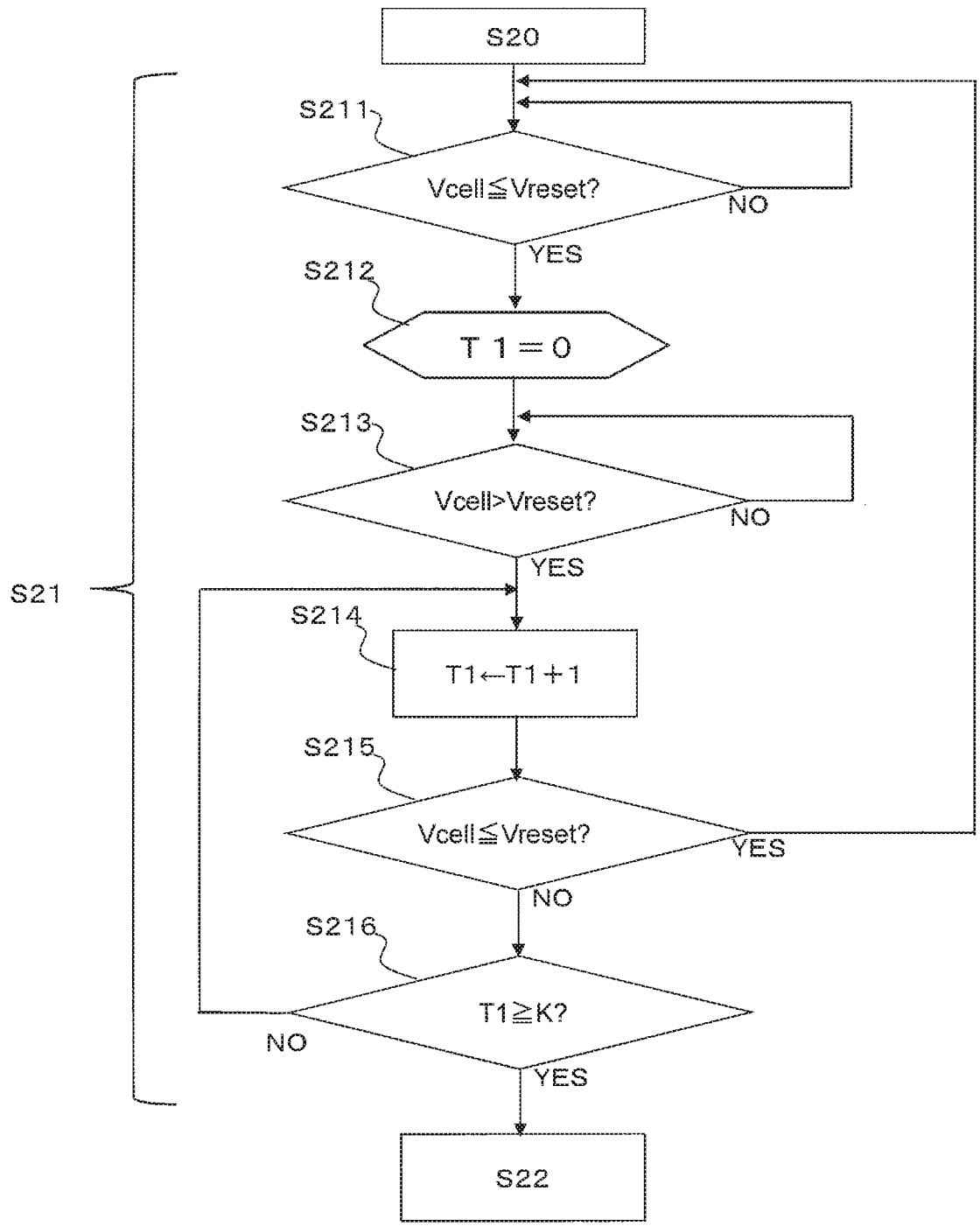
FIG. 12 is a flowchart illustrating the details of partial processing in the flowchart of FIG. 11.
Figure 13:
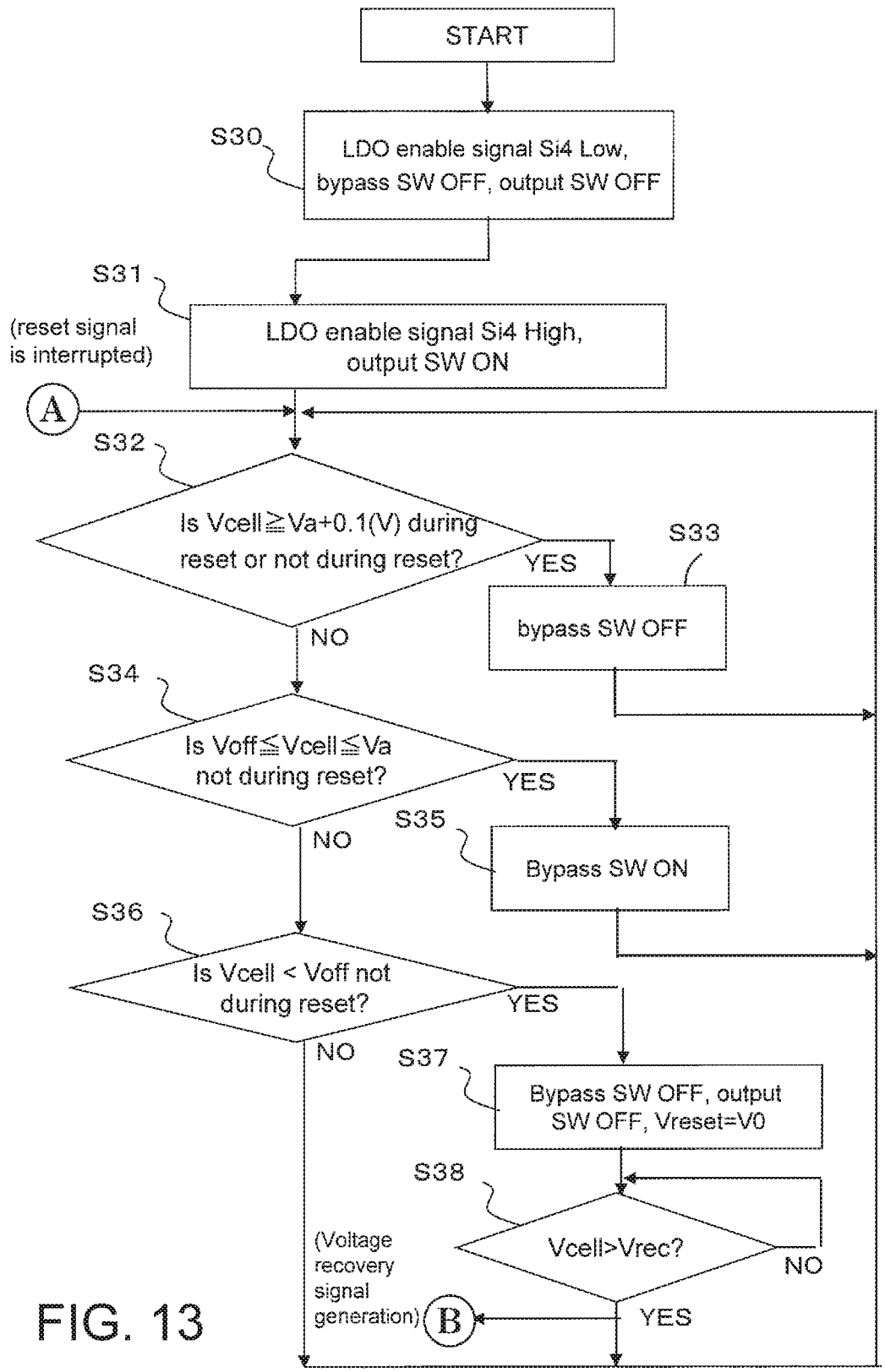
FIG. 13 is a flowchart illustrating a method of switching the ON/OFF status of a bypass SW as a switching unit in another example of the embodiment.

FIG. 11 is a flowchart illustrating the method in the fourth embodiment to switch the execution and stoppage of current output to the mobile terminal unit 16. FIG. 12 is a flowchart illustrating the details of a part of the processing in the flowchart of FIG. 11. FIG. 13 is a flowchart illustrating the method in this example to switch the ON/OFF status of the bypass SW 74. The control unit 36 executes the first program executed by the flowcharts of FIG. 11 and FIG. 12 and the second program executed by the flowchart of FIG. 13 in parallel with a manual reset SW detection program and a USB connection detection program (which will be described later).

First, the following section will describe FIG. 11 and FIG. 12 corresponding to the first program. In S20, the second predetermined voltage Vreset is initialized and is set to the initial value VO (Vreset=VO). For example V0=4.75V is set. Next, in S21, it is determined whether or not a predetermined time has passed since the detection value of the input voltage Vcell became lower than the second predetermined voltage Vreset, and then the input voltage Vcell became higher than the second predetermined voltage Vreset and the input voltage Vcell became higher than the second predetermined voltage Vreset.

FIG. 12 illustrates the processing of S21 divided into a plurality of processing steps. In S21, first, in S211, it is determined whether or not the detection value of the input voltage Vcell is equal to or lower than the second predetermined voltage Vreset. When the determination result of S211 is YES, then the processing proceeds to S212 to set a count variable T1 to an initial value 0. Next, in S213, it is determined whether or not the detection value of the input voltage Vcell is higher than the second predetermined voltage Vreset. When the determination result of S213 is YES, the processing proceeds to S214 to increase the count variable T1 by one. Next, in S215, it is determined whether or not the detection value of the input voltage Vcell is again equal to or lower than the second predetermined voltage Vreset. If the determination result is YES, the processing returns to S211 to repeat the processing. If the determination result of S215 is NO, the processing proceeds to S216 to determine whether or not the count variable TI is equal to or higher than the predetermined value K. If the determination result is NO, the processing returns to S214. If the determination result of S216 is YES, the processing proceeds to S22 of FIG. 11.

In S22, the reset operation is performed by allowing the control unit 36 to turn OFF the output SW 76 to stop the current output from the power output terminal 20 to provide an output OFF status, thus allowing the LDO enable signal Si4 to reach a Low level.

After the processing of S22, the control unit 36 generates a reset signal. When the reset signal is generated, an interrupt processing is performed between S31 and S32 (which will be described later) in the second program executed by the flowchart shown in FIG. 13 (which will be described later).

In S23, it is determined whether or not the predetermined time Tr for the purpose of resetting has passed since the stoppage of the current output from the power output terminal 20. When the determination result of S23 is YES, the processing proceeds to S24. In S24, the control unit 36 turns ON the output SW76 to achieve the reset operation in which current output from the power output terminal 20 is executed, thereby completing the reset operation. In S24, the LDO enable signal Si4 is set to a High level and the bypass SW74 is turned OFF. As a result, the voltage Vreg adjusted by the LDO 30 is outputted to the power output terminal 20.

In S25, the control unit 36 acquires the detection value of the input voltage VcellA from the voltage sensor 72. The control unit 36 acquires the detection value of the input voltage VcellA when the predetermined estimated stable time Tstable set in advance has passed since the current output from the power output terminal 20 was resumed. The predetermined estimated stable time Tstable is 5 seconds, for example. In S26, the second predetermined voltage Vreset is changed to a value obtained by adding predetermined voltage ΔV to the acquired voltage of the input voltage VcellA (Vreset←VcellA+ΔV), and then the processing returns to S21 to repeat the processing. The predetermined voltage ΔV is 0.2V for example. The predetermined voltage ΔV can be variously changed depending on the type of the mobile terminal unit 16 and the IV characteristic of the solar cell module.

Next, the following section will describe the flowchart of FIG. 13 corresponding to the second program. First, in S30, the states of the LDO 30, the bypass SW 74, and the output SW 76 are set to an initial state. Specifically, the control unit 36 is used to set the enable signal Si4 of the LDO 30 to a Low level and to turn OFF the bypass SW 74 and the output SW 76. Next, in S31, the control unit 36 turns ON the output SW 76 while the voltage adjustment by the LDO 30 is being performed with the enable signal Si4 of the LDO 30 set to a High level.

In S32, it is determined whether or not the reset operation is being performed (e.g., the states of S22 and S23 of FIG. 11) (1) or the reset operation is not being performed and the input voltage Vcell is equal to or higher than (predetermined voltage Va+0.1 (V)) (2). In this case, 0.1V is added to provide hysteresis to the predetermined voltage Va and may be an arbitrary positive value other than 0.1V. When the determination result of S32 is YES, the bypass SW 74 is turned OFF (S33) and the processing returns to S32. When the determination result of S32 is NO, the processing proceeds to S34.

In S34, it is determined whether the reset operation is not performed and the input voltage Vcell is equal to or higher than the stoppage voltage Voff set in advance and is equal to or lower than the predetermined voltage Va. When the determination result of S34 is YES, the processing proceeds to S35 to turn ON the bypass SW74. Then, the processing returns to S32. The stoppage voltage Voff is 3.3V for example. When the determination result of S34 is NO, the processing proceeds to S36. By providing hysteresis to the predetermined voltage Va, the bypass SW 74 can be prevented from frequently switching when the input voltage Vcell has a value between the predetermined voltage Va and (predetermined voltage Va+0.1(V)).

In S36, it is determined whether or not the reset operation is not performed and the input voltage Vcell is lower than the stoppage voltage Voff. When the determination result of S36 is YES, the processing proceeds to S37 to turn OFF the bypass SW74 and the output SW76. The second predetermined voltage Vreset is set to the initial value VO. After the processing in S37, S38 is performed so that when the input voltage Vcell is higher than a recovery voltage Vrecover, a voltage recovery signal is generated and an interrupt processing is performed between S23 and S24 in the first program corresponding to FIG. 11, and the processing returns to S32 in the second program. The recovery voltage Vrecover is 4.3V for example. When the determination result of S36 is NO (e.g., when the input voltage Vcell is higher than the predetermined voltage Va and is lower than (predetermined voltage Va+0.1(V))), the processing returns to S32.

When the manual reset SW 78 is operated in the first program, a manual reset SW detection program may be executed. The manual reset SW detection program determines whether the manual reset SW 78 is operated or not.

When the manual reset SW detection program determines that the manual reset SW 78 is operated, then the manual reset SW detection program generates a manual reset SW signal. When the manual reset SW signal is generated, the first program is subjected to an interrupt processing to stop the processing of the first program. Then, the processing between S21 and S22 is resumed. In this case, prior to the processing in S22, the second predetermined voltage Vreset may be set to the initial value VO. This consequently allows the control unit 36, when the manual reset SW 78 is operated, to stop the current output from the power output terminal 20 over the predetermined time Tr for the purpose of resetting, as described above.

When the state in which the power output terminal 20 is separated from the USB terminal 42 of the mobile terminal unit 16 (see FIG. 1) changes to the state in which the power output terminal 20 is newly connected to the USB terminal 42, the mobile terminal unit 16 is configured so that one signal terminal (e.g., the signal terminal 44c of D−) of the signal terminals 44c and 44d has a lowered potential which may change to a Low potential.

The USB connection detection program is configured, when it is determined that one signal terminal 44c in the control unit 36 newly has a Low potential, to determine whether or not the input voltage Vcell is equal to or higher than the recovery voltage Vrecover set in advance. When determining that the input voltage Vcell is equal to or higher than the recovery voltage Vrecover, the USB connection detection program generates the USB connection detection signal. When the USB connection detection signal is generated, the first program is subjected to an interrupt processing to stop the processing in the first program. Then, the processing between S23 and S24 is resumed. Thereafter, current output from the power output terminal 20 is executed. Alternatively, the second predetermined voltage Vreset may be set to the initial value VO and then the first program may be subjected to the interrupt processing. This consequently allows the control unit 36, when the power output terminal 20 is newly connected to the mobile terminal unit 16, to change the second predetermined voltage Vreset to a voltage higher than the acquired voltage VcellA by the predetermined voltage $\Delta V$ (Vreset=vcellA+$\Delta V$).

Until the predetermined period has passed since the mobile terminal unit 16 was connected by the USB connection detection program, the processing for detecting the connection is preferably stopped. Similarly, the detection processing by the USB connection detection program is preferably stopped after the reset operation.

According to the configuration of the fourth embodiment, a stable reset operation can be performed regardless of a change in the charging characteristic of the mobile terminal unit 16 and the I-V characteristic showing the current voltage characteristic of the solar cell module 12 due to the usage environment or manufacturing variation. Thus, the mobile terminal unit 16 can be charged more efficiently. Next, this will be described in detail.

Figure 14A:
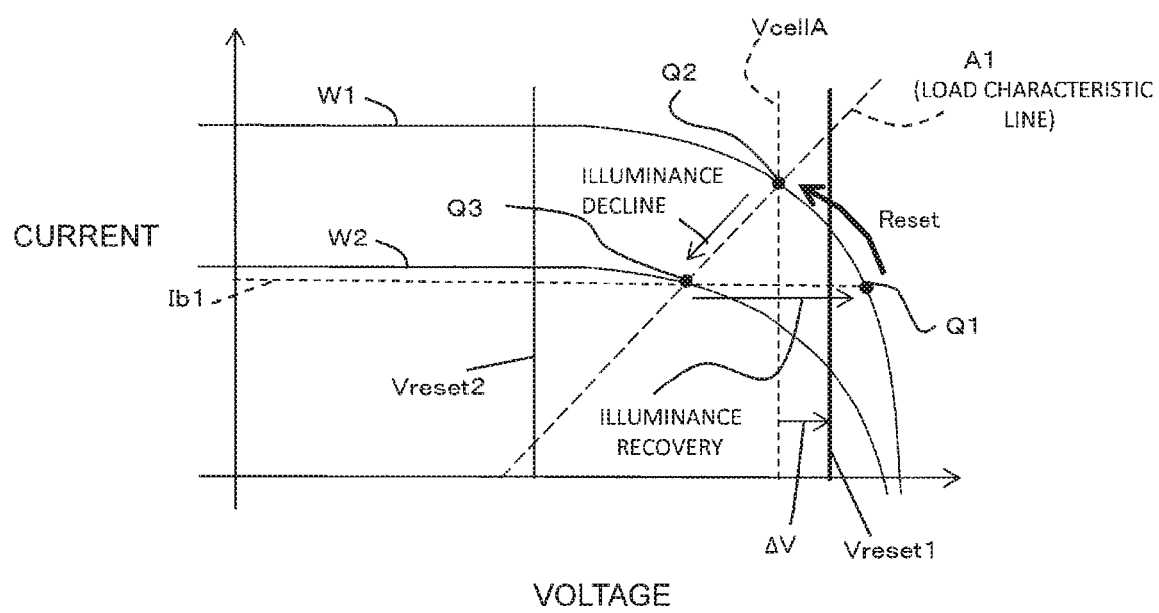
FIG. 14A illustrates two current voltage characteristics of a solar cell module for explaining the effect of another example of the embodiment.

FIG. 14A illustrates two I-V characteristics of the solar cell module 12 to explain the effect of the fourth embodiment. In the embodiments shown in FIG. 1 to FIG. 9, when the second predetermined voltage Vreset that is a reference voltage to stop the current output from the power output terminal 20 is fixed, this second predetermined voltage Vreset may be inappropriate. For example, FIG. 14A shows the two types of I-V characteristic lines WI and W2 of the solar cell module 12. When the illuminance on the light-receiving face declines, WI changes to W2. When the solar cell module 12 outputs current and voltage along WI, depending on the current output from the power output terminal 20 to the mobile terminal unit 16, the charging operation is stably performed at an intersection point 02 with the load characteristic line AI of the mobile terminal unit 16. When the illuminance on the light-receiving face declines, a case may be considered in which the charging operation point also declines along the load characteristic line AI to reach W2. In this case, some mobile terminal unit 16 may limit the input current to the mobile terminal unit 16 to a value equal to or lower than the current value lb1 of the point Q3. Even when the illuminance on the light-receiving face is recovered, the operation point moves to a point at which the current value lb1 is fixed and the voltage value is high (e.g., Q1). In the embodiments from FIG. 1 to FIG. 9, the reset operation is performed to stop the current output from the power output terminal 20 over the predetermined time Tr for the purpose of resetting when the predetermined time has passed since the input voltage Vcell was equal to or lower than the second predetermined voltage Vreset (Vreset1 of FIG. 14A) and subsequently becomes higher than the second predetermined voltage Vreset. As a result, the limitation upon the input current of the mobile terminal unit 16 is cancelled and the charging operation in the initial status is returned to. Then, the operation point during charging is Q2, thus providing an efficient charging operation.

However, the characteristic of the mobile terminal unit 16 or the characteristic of the solar cell module 12 or a manufacturing variation may cause a different value appropriate for the second predetermined voltage Vreset. For example, when the second predetermined voltage Vreset is set to Vreset2 of FIG. 14A, even when a declined illuminance on the light-receiving face causes the operation point to move from Q2 to Q3, the input voltage Vcell is prevented from having a value equal to or lower than the second predetermined voltage Vreset2. Thus, no reset operation is performed even when the subsequent recovery of illuminance causes the operation point to move to the point Q1. Thus, the operation point does not move to Q2. In this case, a stable reset operation can be carried out in an improved manner.

Figure 14B:
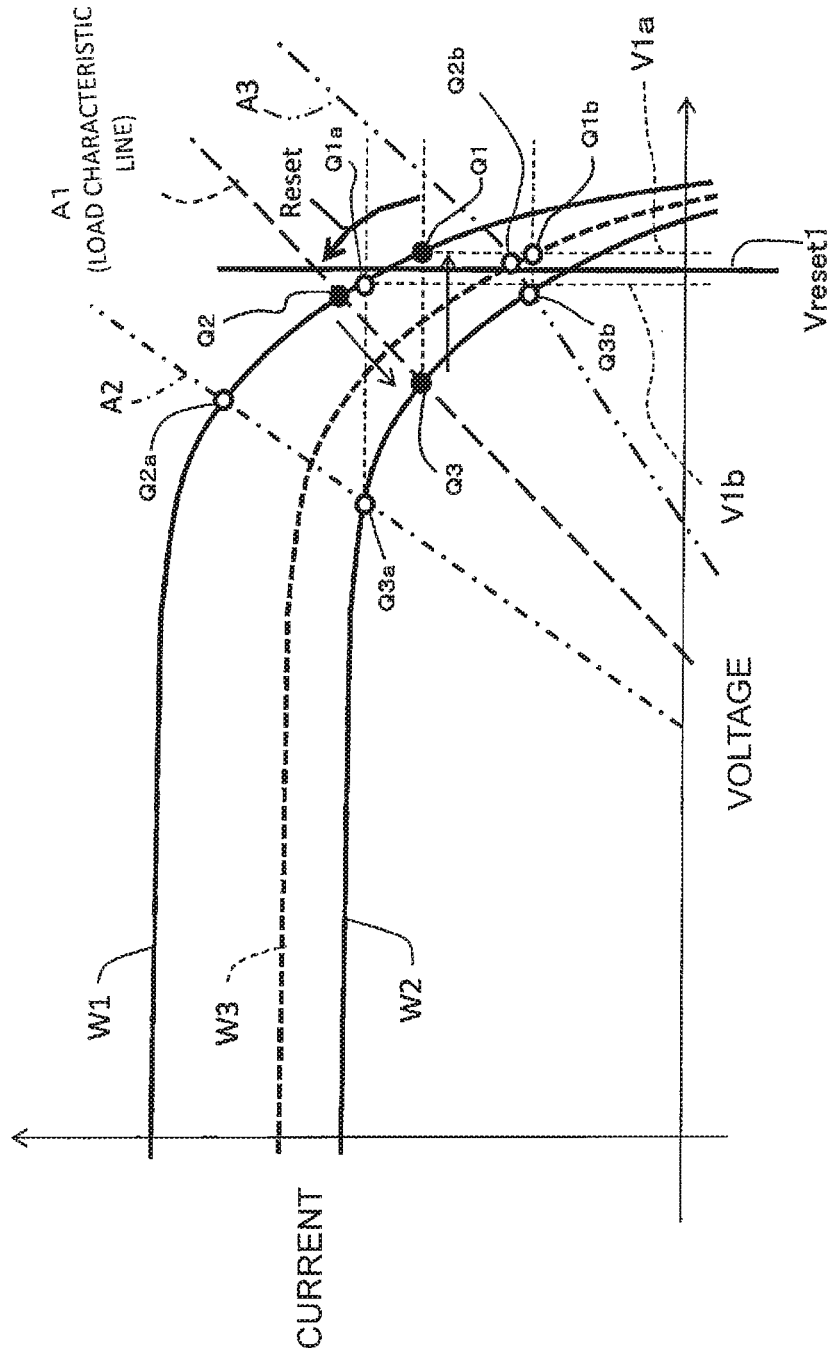
FIG. 14B illustrates two current voltage characteristics of a solar cell module for explaining the effect of another example of the embodiment.

As shown in FIG. 14B, a difference in the type of the mobile terminal unit 16 may require different load characteristic lines A1, A2, or A3 for example. Thus, even when the second predetermined voltage Vreset1 is appropriately set for A1, the second predetermined voltage Vreset1 may be inappropriate for A2 and A3. For example, there may be a case as shown in FIG. 14B in which, even when the voltage at the charging operation point 03a of the intersection point of A2 and W2 is significantly lower than the voltage at Q3 and the illuminance is recovered and the charging operation point moves to the intersection point Q1a with WI for example, the voltage V1b at the charging operation point may not exceed the second predetermined voltage Vreset1 (V1b<Vreset1). In this case, no reset operation is performed. Thus, a stable reset operation can be carried out in an improved manner. Furthermore, when the voltage at the charging operation point Q3b of the intersection point of A3 and W2 is significantly higher than the voltage at Q3, the voltage at the charging operation point may exceed the second predetermined voltage Vreset1, even when the illuminance recovers to a low level. For example, the voltage exceeds the second predetermined voltage Vreset1 when the charging operation point merely moves from Q3 to the intersection point Q1b with the I-V characteristic line W3 between WI and W2. As a result, the reset operation is performed and the charging operation point moves to Q2b having a current value slightly higher than that of Q1b, and having a low voltage value. However, as shown in FIG. 14B, when a difference between the voltage value at Q2b and the second predetermined voltage Vreset1 is small, a reset operation may be frequently carried out depending on a slight change in the illuminance. This is due to a small difference between the voltage value of the charging operation point Q3b and the second predetermined voltage Vreset1.

As described above, when the second predetermined voltage Vreset is maintained to have a fixed value, the mobile terminal unit 16 may have a different charging characteristic, a manufacturing variation may cause the solar cell module 12 to have a different I-V characteristic, or the I-V characteristic may change due to a change in the environment during the operation of the solar cell module 12 (e.g., temperature, brightness). In this case, a stable reset operation can be carried out in an improved manner.

In the fourth embodiment, the second predetermined voltage Vreset, which is a reference voltage to stop the current output from the power output terminal 20 as described above, is changed to a voltage higher by the predetermined voltage than the acquired voltage of the input voltage VcellA when the predetermined estimated stable time Tstable has passed since the stoppage of the current output from the power output terminal 20 (Vreset=vcellA+ ΔV). As a result, a stable reset operation can be performed regardless of the charging characteristic of the mobile terminal unit 16, a change of the IV characteristic of the solar cell module 12 due to the usage environment, or a manufacturing variation, thus charging the mobile terminal unit 16 more efficiently. Furthermore, a reset operation can be appropriately performed even when being regulated by a difference in the reaction method of the mobile terminal unit 16, and an operation point at which a charging operation is determined based on predetermined current value and voltage value depending on whether predetermined conditions are established or not, or a discrete operation point, thus charging the mobile terminal unit 16 efficiently.

Furthermore, the control unit 36 is configured, when the manual reset SW78 is operated, to perform a reset operation to stop the current output from the power output terminal 20 regardless of the relation between the acquired value of the current input voltage Vcell and the value of the second predetermined voltage Vreset. Then, based on the acquired voltage VcellA of the input voltage when the predetermined estimated stable time Tstable has passed since the current output after the reset operation was resumed, the control unit 36 changes the second predetermined voltage Vreset to a value higher than the voltage VcellA (Vreset←Vcell1A+ ΔV). As a result, even when the second predetermined voltage Vreset moves excessively upward or downward to prevent a reset operation from being performed, a user can determine to change the second predetermined voltage Vreset to an appropriate value. The second predetermined voltage Vreset is also set to an appropriate value depending on a signal sent from the power output terminal 20 to the control unit 36 when the power output terminal 20 is newly connected to the mobile terminal unit 16. Thus, a change to an appropriate second predetermined voltage Vreset depending on a different mobile terminal unit 16 can be achieved within a short time. When the manual reset SW78 is operated and when the power output terminal 20 is newly connected to the mobile terminal unit 16, the method of FIG. 11 changes the second predetermined voltage Vreset to the initial value V0. However, this change may be omitted.

The control unit 36 compares a value obtained by adding hysteresis to the predetermined voltage Va with the value of the input voltage Vcell, to determine whether the bypass SW 74 is turned OFF or not. The control unit 36 compares the value of predetermined voltage Va with the value of the input voltage Vcell to determine whether the bypass SW 74 is turned ON of not. This can consequently suppress the chattering caused when the bypass SW 74 is frequently turned ON and OFF. The configuration to suppress the chattering by hysteresis as described above may be used in the above configurations of FIG. 1 to FIG. 9. The other configurations and actions are the same as those of FIG. 1 to FIG. 5.

The configurations shown in FIG. 10 to FIG. 13 in which, based on the acquired voltage VcellA of the input voltage when the predetermined estimated stable time Tstable has passed since the reset operation, the second predetermined voltage Vreset is changed to a voltage higher than the acquired voltage VcellA, can also be used in a configuration in which the configurations of FIG. 1 to FIG. 8 include a voltage sensor for detecting input voltage Vcell for which an acquired voltage is sent to the control unit 36, or in the configuration of FIG. 9.

As described above, an embodiment for carrying out the present invention has been described. However, the present invention is not limited to the embodiment and can be carried out in various embodiments within a range not deviating from the scope of the present invention. For example, a case in which the voltage adjustment unit is the voltage regulator 30 has been described above. However, the invention is not limited to this. For example, the voltage adjustment unit may be a voltage converter such as a DC/DC converter that subjects the input voltage Vcell to a voltage adjustment to output to the power output terminal a voltage adjusted to a predetermined voltage or less.

The relation between the predetermined voltage Va and the second predetermined voltage Vreset used in the first signal generation unit 26 and the second signal generation unit 28 is not limited to the one in this embodiment. The predetermined voltage Va and the second predetermined voltage Vreset may be appropriately set depending on the configuration or size of the solar cell module 12 to be used, the operation characteristic of the mobile terminal unit 16, or a usage environment. The second predetermined voltage Vreset may be set to a value higher than the predetermined voltage Va (Vreset>Va). The relation between the voltage Vreg adjusted by the voltage regulator 30 and the predetermined voltage Va is also not limited to the one of this embodiment. For example, the voltage Vreg may be lower than the predetermined voltage Va (Vreg<Va). On the contrary, the voltage Vreg may be higher than the predetermined voltage Va (Vreg>Va).

The configuration in which the power feeding apparatus 14 includes the second signal generation unit 28 and the control unit 36 blocks the output from the power output terminal 20 over the predetermined time Tr for the purpose of resetting when the predetermined time t1 has passed since the input voltage Vcell exceeds the second predetermined voltage Vreset can also be combined with a configuration in which the bypass line 32 does not include a switching unit.

DESCRIPTION OF REFERENCE NUMERALS

10 Solar cell system
12 Solar cell module
14 Power feeding apparatus
16 Mobile terminal unit
18 Power input terminal
20 Power output terminal 22 Machine-side secondary battery
24 System control circuit
26 First signal generation unit
28 Second signal generation unit
30 Voltage regulator (LDO)
32 Bypass line
34 Relay
36 Control unit
38 Solar cell
40 USB cable
42 USB terminal
44a and 44b Power feeding terminal
44c and 44d Signal terminal
46 Input terminal
48 GND terminal
49 Output line
50 Output terminal
54 Switch body
56 Coil
58 Connection control unit
60 Time measurement unit
62 Voltage supply control unit
64 Output line
66 Second relay
68 Switch body
70 Coil
72 Voltage sensor
74 FET (bypass SW)
76 Gate IC (output SW)
78 Manual reset switch
80 Impedance converter

The invention claimed is:

1. A power feeding apparatus for solar cells for adjusting an input voltage inputted from a solar cell to a predetermined voltage or less and outputting the adjusted voltage as a charging output voltage of a secondary battery, comprising:
a voltage adjustment unit for subjecting the input voltage to a voltage adjustment and outputting a voltage adjusted to a voltage set in advance or less;
a switching unit that is provided in a bypass line connected between a power input terminal and a power output terminal without being routed to the voltage adjustment unit, and that switches the connection and disconnection of the bypass line; and
a control unit configured, when the input voltage is equal to or lower than the predetermined voltage, to control the switching unit to connect the bypass line to output the input voltage from the power output terminal;
wherein the power feeding apparatus includes a second signal generation unit configured, when the input voltage is higher than the second predetermined voltage, to output a second signal having a high level to the control unit, and
the control unit stops the current output from the power output terminal when a predetermined time has passed since the second signal having the high level was outputted.

2. A power feeding apparatus for solar cells for adjusting an input voltage inputted from a solar cell to a predetermined voltage or less and outputting the adjusted voltage as a charging output voltage of a secondary battery, comprising:
a voltage adjustment unit for subjecting the input voltage to a voltage adjustment and outputting a voltage adjusted to a voltage set in advance or less;
a switching unit that is provided in a bypass line connected between a power input terminal and a power output terminal without being routed to the voltage adjustment unit, and that switches the connection and disconnection of the bypass line; and
a control unit configured, when the input voltage is equal to or lower than the predetermined voltage, to control the switching unit to connect the bypass line to output the input voltage from the power output terminal;
wherein the control unit stops the current output from the power output terminal when a predetermined time has passed since the value of the input voltage was equal to or lower than that of the second predetermined voltage and then becomes higher than that of the second predetermined voltage.

3. The power feeding apparatus for solar cells according to claim 1, wherein:
the second predetermined voltage is changed to a voltage higher than the acquired voltage based on the acquired voltage of the input voltage when a predetermined estimated stable time has passed since the current output from the power output terminal was stopped, and current output was resumed.

4. The power feeding apparatus for solar cells according to claim 3, wherein:
the power feeding apparatus includes a reset operation unit provided to be operated by a user, and
the control unit is configured, when the reset operation unit is operated, to stop the current output from the power output terminal regardless of the relation between the current input voltage and the value of the second predetermined voltage and, based on the acquired voltage of the input voltage when a predetermined estimated stable time has passed since the current output was resumed, to change the second predetermined voltage to a voltage higher than that of the acquired voltage.

5. The power feeding apparatus for solar cells according to claim 1, wherein:
the control unit controls the voltage adjustment unit to stop the current output from the power output terminal when a predetermined time has passed since the second signal was outputted.

6. The power feeding apparatus for solar cells according to claim 1, wherein:
the power feeding apparatus includes a second switching unit that is provided in an output line between the voltage adjustment unit and the power output terminal and that switches the connection and disconnection of the output line, and
the control unit is configured, when a predetermined time has passed since the second signal is outputted, to use the second switching unit to control the output line to be disconnected.

* * * * *